United States Patent
Colombo et al.

(10) Patent No.: US 7,229,873 B2
(45) Date of Patent: Jun. 12, 2007

(54) PROCESS FOR MANUFACTURING DUAL WORK FUNCTION METAL GATES IN A MICROELECTRONICS DEVICE

(75) Inventors: Luigi Colombo, Dallas, TX (US); James J. Chambers, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/200,741

(22) Filed: Aug. 10, 2005

(65) Prior Publication Data

US 2007/0037343 A1   Feb. 15, 2007

(51) Int. Cl.
*H01L 21/336* (2006.01)
*H01L 21/8234* (2006.01)
*H01L 21/8238* (2006.01)
*H01L 21/04* (2006.01)
*H01L 21/4763* (2006.01)
*H01L 21/3205* (2006.01)

(52) U.S. Cl. .............. 438/231; 438/197; 438/199; 438/233; 438/510; 438/592; 257/E21.623; 257/E21.587; 257/E21.632; 257/E21.627

(58) Field of Classification Search ............ 438/231, 438/197, 199, 233, 510, 592
See application file for complete search history.

(56) References Cited

U.S. PATENT DOCUMENTS

2006/0019437 A1 * 1/2006 Murto et al. ............... 438/199
2006/0084247 A1 * 4/2006 Liu .......................... 438/510
2006/0134844 A1 * 6/2006 Lu et al. .................... 438/199

OTHER PUBLICATIONS

C. Ren et al.; "A Dual-Metal Gate Integration Process for CMOS With Sub-1-nm EOT HfO2 by Using HfN Replacement Gate"; IEEE Electron Device Letters, vol. 25, No. 8, Aug. 2004; pp. 580-582.

Seongjun Park, et al.; "Ab Initio Study of Metal Gate Electrode Work Function"; Applied Physics Letters, 86, 2005 American Institute of Physics; pp. 1-3.

* cited by examiner

*Primary Examiner*—Michael Lebentritt
*Assistant Examiner*—Mohsen Ahmadi
(74) *Attorney, Agent, or Firm*—Patrick K. McLarty; W. James Brady, III; Frederick J. Telecky, Jr.

(57) ABSTRACT

The present invention provides a method of forming a dual work function metal gate microelectronics device 200. In one aspect, the method includes forming nMOS and pMOS stacked gate structures 315a and 315b. The nMOS and pMOS stacked gate structures 315a and 315b each comprise a gate dielectric 205, a first metal layer, 305 located over the gate dielectric 205 and a sacrificial gate layer 310 located over the first metal layer 305. The method further includes removing the sacrificial gate layer 310 in at least one of the nMOS or pMOS stacked gate structures, thereby forming a gate opening 825 and modifying the first metal layer 305 within the gate opening 825 to form a gate electrode with a desired work function.

23 Claims, 17 Drawing Sheets

PROCESS FOR MANUFACTURING DUAL WORK FUNCTION METAL GATES IN A MICROELECTRONICS DEVICE

TECHNICAL FIELD OF THE INVENTION

The present invention is directed in general to a method for manufacturing microelectronic devices and, more specifically, to manufacturing dual work function metal gates for microelectronic devices.

BACKGROUND

The ability to dope polysilicon gates to different degrees allows one to adjust the work function of gate electrode materials to particular types of metal oxide silicon (MOS) transistors. It is desirable to adjust the work function of a gate electrode (hereinafter, the gate), to be close to either the conduction band or the valence band of silicon, because this reduces the threshold voltage ($V_t$) of the transistor, thereby facilitating a high drive current at low operating voltages. For instance, dual work function gates, for example doped polysilicon are advantageously used in microelectronic devices, such as complementary metal oxide silicon (CMOS) transistor devices, having both pMOS and nMOS transistors. The use of doped polysilicon gates has become problematic, however, as the dimensions of gates and gate insulators alike have significantly reduced.

It is well understood that polysilicon gates can accommodate only a finite amount of dopants. This limitation can result in a depletion of gate charge carriers at the interface between the gate and gate dielectric, when the gate is biased to invert the channel. Consequently, the electrical thickness of the gate stack is substantially increased, thereby deteriorating the performance characteristics of the transistor, such as reducing the drive current and slowing switching speeds. For instance, the effective electrical thickness of a gate dielectric in some pMOS transistors can increase from about 1.0 nanometer during accumulation mode, to about 1.8 nanometers during inversion mode. Depletion of the polysilicon gate is a fundamental issue that limits further scaling of MOS devices.

In addition, when high-k gate dielectrics are used with polysilicon a $V_t$ offset of up to 700 mV is observed for pMOS devices depending on the composition of the high-k gate dielectric. This large $V_t$ offset is still not clearly understood but is believed to be associated with dopant (e.g., boron) diffusion and interaction with the gate dielectric and Fermi level pinning as a result of defect creation between the gate and the dielectric. At present, there is no effective way to control this $V_t$ offset problem.

In view of the shortcomings of doped polysilicon in view of today's device sizes, metal gates are an attractive alternative to polysilicon because they have larger supply of charge carriers than doped polysilicon gates. When a metal gate is biased to invert the channel, there is no substantial depletion of carriers at the interface between the metal gate and gate dielectric. Accordingly, the transistor's performance is not deteriorated because the electrical thickness of the gate stack is not increased. In the manufacture of microelectronic devices, having independently adjustable dual work function metal gates has been troublesome, however.

Ideally, dual work function metal gates should be compatible with the type of device in which it will operate. If it is an nMOS gate, then its work function needs to be a work function that is compatible for an nMOS device. If on the other hand, the gate is intended to be a gate for a pMOS device, then its work functions needs to a work function that is compatible for a pMOS device. However, during fabrication processes and due primarily to the thermal budgets involved, the work function of each of these metal gates may shift or drift either up or down, thereby changing the work function and consequently, device performance.

Devices created using the conventional process flow that can also be referred to as gate first process flow allow a high quality gate dielectric to remain intact, but the gates manufactured under such processes suffer from potential work function drift because of potential degradation of the gate dielectric/gate interface upon exposure to high thermal budgets (e.g., those in excess of 700 degrees Celsius) to which it is subjected. To avoid the effects associated with these thermal budgets, manufacturers have developed gate last processes where the gate is formed after the high thermal budgets have been done. Unfortunately, however, during their fabrication, the gate dielectric is typically removed when the dummy gate is removed to form the metal gate electrode. In such instances, the gate dielectric has to be regrown or deposited but done so under lower formation temperatures so as not to disturb the source/drain implants that have already been formed. This process results in a lower quality gate dielectric. Thus, presently, the industry is left with the choice of either having a high quality gate dielectric and contending with work function drift or having a gate dielectric with a more stable work function but a lower quality gate dielectric. Neither of these choices are desirable in view of the demands for higher quality devices that operate at high speed and with greater efficiency.

Accordingly, what is needed in the art is a method of manufacturing microelectronic devices that avoid the disadvantages associated with the current manufacturing processes.

SUMMARY OF INVENTION

To overcome the deficiencies in the prior art, the present invention, in one embodiment, provides a method of forming a dual work function metal gate microelectronics device. This embodiment comprises forming a stacked gate structure in each of a pMOS region and an nMOS region of a microelectronics substrate. The gate structure comprises a gate dielectric, a first metal layer located over the gate dielectric, and a sacrificial gate layer located over the first metal layer. The method further comprises removing the sacrificial gate layer in at least one of the nMOS or pMOS regions, thereby forming a gate opening, and modifying the first metal layer within the gate opening to form a gate electrode with a desired work function.

In another aspect, the present invention provides a process for forming an integrated circuit having dual work function metal gates. This method comprises forming transistors over a microelectronics substrate. The building of a transistor gate comprises forming a stacked gate structure in each of a pMOS region and an nMOS region of a microelectronics substrate. The gate structure comprises a gate dielectric, a first metal layer located over the gate dielectric and a sacrificial gate layer located over the first metal layer. This aspect of this embodiment further comprises removing the sacrificial gate layer in at least one of the nMOS or pMOS regions, thereby forming a gate opening and modifying the first metal layer within the gate opening to form a gate electrode with a desired work function. Source/drains are also formed in the microelectronics substrate prior to removing the sacrificial gate layer. Interconnects are formed in dielectric layers located over the transistors to interconnect the transistors and form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the microelectronic industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention overcomes previous difficulties in the production of devices having dual work function metal gates by providing a process that allows for a high quality gate dielectric while deferring metal gate formation until after high thermal budgets are conducted, such as those conducted to form the gate dielectric, source/drains and silicided contacts. Moreover, because the metal gates are formed after the conduction of these high thermal processes, work function drift is minimized and metal combinations that formerly have been unavailable are now available for use in the metal gate formation. This process, therefore, provides for a high quality gate dielectric while avoiding work function drift within the metal gates. Such dual gate configurations facilitate work function control of the gates to enable dual gate microelectronic devices to be constructed with lower threshold voltages and higher reliability than previously obtainable.

The term, work function, is well known and defined as the minimum energy required to bring an electron from the Fermi level to the vacuum level. For the purposes of the present invention, a gate's work function is matched to one of a conduction band or a valence band of a microelectronic substrate when the work function is within about 0.4 eV, and more preferably about 0.2 eV, of the energy level of the substrate's conduction band or valence band. As an example, a gate's work function is matched to a silicon substrate's valence band when the gate work function is greater than about 4.8 eV, and more preferably between about 4.9 and about 5.2 eV. Alternatively a gate's work function is matched to a silicon substrate's conduction band when the gate work function is less than about 4.4 eV and more preferably, between about 4.0 and about 4.3 eV.

Of course, the energy levels corresponding to the valence and conduction bands differ depending on the type of material used for the microelectronic substrate and the type and concentration of any dopants in the substrate. One skilled in the art should understand how to determine specific energy level values for the microelectronic substrate of interest and define gate work functions that would match the valence or conduction bands, as appropriate.

Figure 1:
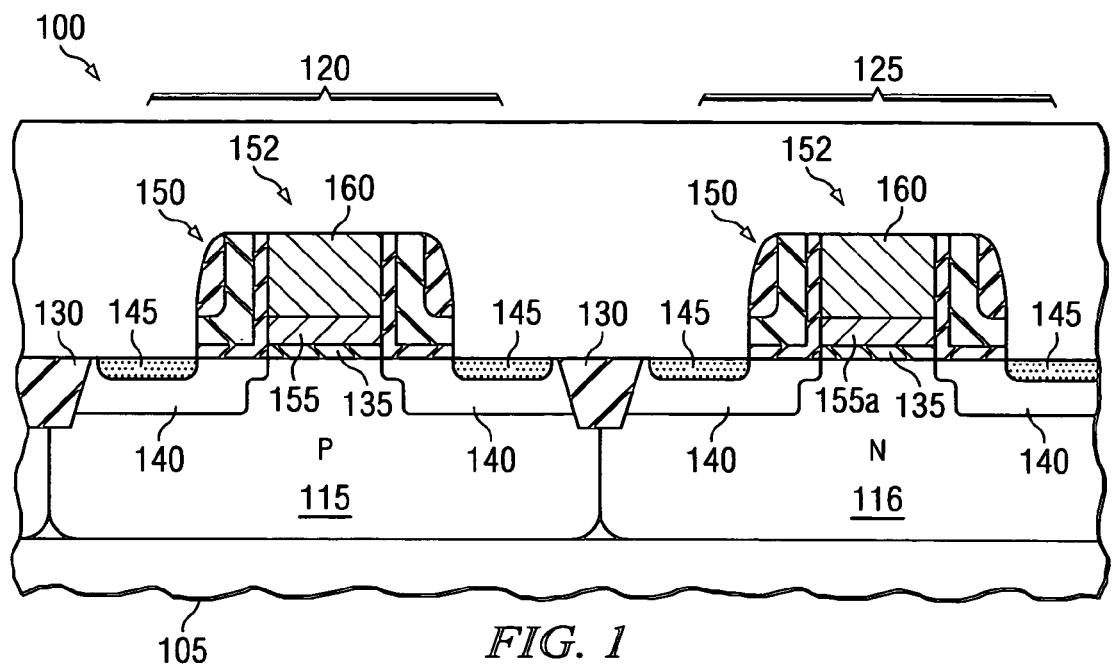
FIG. 1 illustrates partial, sectional view of a microelectronics device upon completion of the formation of an nMOS transistor and a pMOS transistor having a metal gate electrode with a modified work function.

Referring initially to FIG. 1, there is illustrated a partial, sectional view of a microelectronics device 100 as provided by one embodiment of the present that has been completed to the pre-metal dielectric stage. The illustrated microelectronics device comprises a microelectronics substrate 105 having a conduction band and a valence band. In some advantageous embodiments, the microelectronic substrate 105 is made of silicon, although other conventional substrate materials, such as silicon-on-insulator, germanium on insulator, silicon germanium on insulator, gallium arsenide, germanium, and silicon-germanium substrates, are also within the scope of the invention. For instance, the microelectronic substrate 105 can be a layer located in the partially completed device 100, including a silicon wafer itself or a layer located above the wafer, such as an epitaxial layer, silicon layer of a silicon-on-insulator (SOI) substrate, or other substrate, such as silicon carbide. The microelectronic substrate 105 can be p-type or n-type and, as illustrated in FIG. 1, further may include a p-type doped well 115 and an n-type doped well 116 in the substrate 105. Of course, other dopant configurations are also within the scope of the present invention. As well understood by those skilled in the art, regardless of the type of material and dopant used, the microelectronic substrate 105 has a conduction band and a valence band.

As further illustrated in FIG. 1, the device 100 includes two regions: an nMOS transistor 120 and a pMOS transistor 125, which can be doped to form a complementary device. Those skilled in the art understand that for the nMOS transistor 120, the well is p-type doped, while for the pMOS transistor 125, the well is n-type doped. In certain configurations, the dual work function metal gate microelectronic device 100 is a CMOS device. The first and second transistors 120, 125 are preferably separated by conventional isolation structures 130, such as shallow trench isolation structures. Although the complementary device is illustrated for exemplary purposes, other device configurations well known to those skilled in the art, are also within the scope of the present invention.

The nMOS and pMOS transistors 120 and 125 each include a gate dielectric 135. Preferably, the gate dielectric 135 is a high quality dielectric. Any conventional technique can be used to form the gate dielectric layer 135, including thermal growth processes, atomic layer, and chemical vapor and physical vapor depositions processes. The nMOS and pMOS transistors 120 and 125 also include appropriately doped source/drains 140 located in the respective wells 115 and 116, and silicided contacts 145. Also included are sidewall spacers 150, such as oxide-nitride-oxide spacers. Gate electrode structures 152 are located over each of the gate dielectrics 140 and adjacent the source/drains 140 and between the sidewall spacers 150. The gate electrode structures 152 include nMOS and pMOS metal gate electrodes 155, 155a, respectively, formed, as described below, and a gate contact 160. In an advantageous embodiment, the nMOS and pMOS metal gate electrodes 155, 155a are formed after the high thermal budgets have been conducted to avoid work function drift. Not only can the work function drift, therefore, be minimized, but the high quality gate dielectric 135 does not have to be removed or otherwise disturbed during the formation of the nMOS and pMOS metal gate electrodes 155, 155a. This ensures that the original quality of the gate dielectric 135 is left substantially intact.

Figure 2:
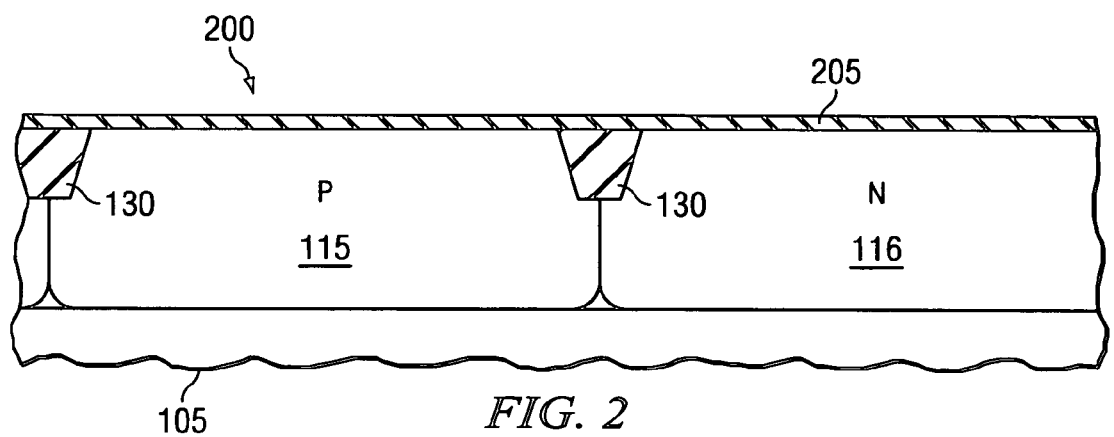
FIG. 2 illustrates a partial, sectional view of a microelectronics device at an early stage of manufacture that results in the device of FIG. 1 wherein a gate dielectric has been deposited over a substrate.

Turning now to FIG. 2, depicted is a partial, sectional view of a microelectronics device 200 at a very early stage of the manufacture of the microelectronics device 100 of FIG. 1. As seen in this view, a dielectric layer 205 has been formed over the microelectronic substrate 105 and over both the nMOS and pMOS wells 115, 116. The dielectric layer 205 is preferably a high quality gate dielectric that is formed by way of conventional materials, including atomic layer deposition (ALD), physical vapor deposition (PVD), chemical vapor deposition (CVD), high temperature oxidation process, or other procedures well known to those skilled in the art. In some embodiments, the dielectric layer 205 is formed using a high thermal budget with temperatures in the range between 700 and 1100 degrees Celsius to yield a high quality gate dielectric with low defect and trap densities.

Thus, it is highly desirable that this dielectric layer 205 remain undisturbed as much as possible during subsequent fabrication processes to maintain its high quality integrity. It should be noted that the thermal budget of a given process will vary depending on the generation of the technology, inasmuch as thermal budgets have generally declined from one generation to the next. However, typically, the higher thermal budgets will involve the formation of not only the gate dielectric but also the temperatures required to dope and activate the source/drains. Thus, the present invention is not limited to any particular generation of technology.

In some embodiments, the dielectric layer 205 comprises a refractory metal. For the purposes of the present invention, a refractory metal is defined as any element in Groups 4-6 and Periods 4-6 of the Periodic Table of Elements, as well as elements in the Lanthanide and Actinide series (International Union of Pure and Applied Chemist Convention for designating Groups and Periods). In certain preferred embodiments, the dielectric layer 205 is a high-k dielectric material, that is, a material having a dielectric constant of greater than about 4, and more preferably between about 6 and about 20. Non-limiting examples include silicon oxynitride, hafnium oxide, hafnium oxynitride, hafnium silicon oxynitride, zirconium oxide, zirconium oxynitride, zirconium silicon oxynitride, titanium oxide, titanium oxynitride, titanium silicon oxynitride or tantlum silicon oxynitride. Other materials well known to those skilled in the art are also within the scope of the present invention.

Figure 3A:
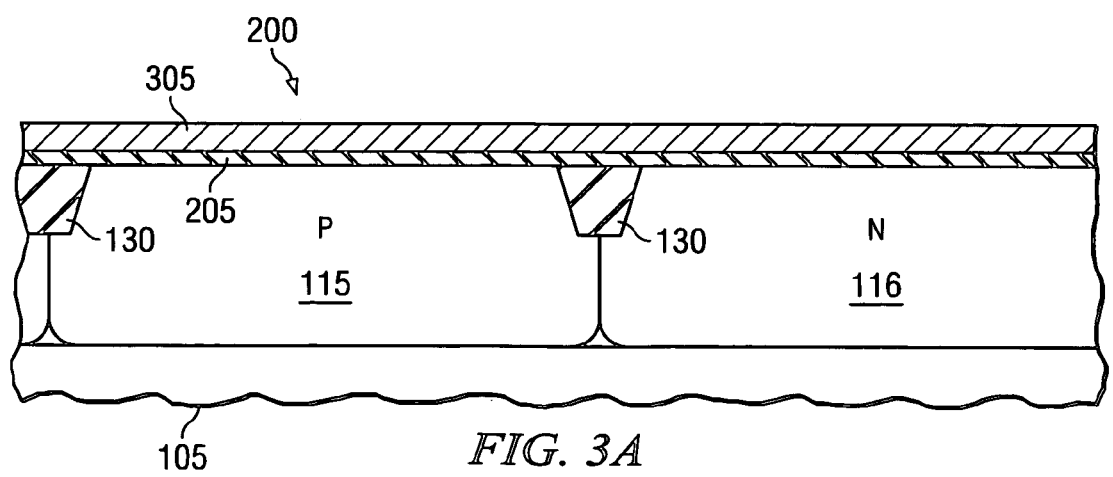
FIG. 3A illustrates a partial, sectional view of the microelectronics device of FIG. 2 after the formation of a metal layer over the gate dielectric.

FIG. 3A illustrates a partial, sectional view of the microelectronics device 200 after the formation of a metal layer 305 that has been blanket deposited over, and preferably on, the dielectric layer 205. The metal layer 305 can be formed using any number of conventional deposition processes. For instance, the metal layer 305 can be deposited using physical vapor deposition (PVD), such as sputtering, atomic layer deposition (ALD), chemical vapor deposition (CVD), or other deposition techniques. In the case of a metal compound (for example a metal silicide), this layer may also be formed through solid state reaction between two layers deposited sequentially and then annealed. The thickness of the metal layer 305 may vary. In exemplary embodiments, the thickness of the metal layer 305 may range from about 1.5 nm to about 10 nm.

The work function of the metal layer 305 can be modified as discussed below to form a portion of the gate electrode structures 152, as depicted in FIG. 1. Various metals and alloys thereof may be used to form the metal layer 305. For example, and not by way of limitation, the metal layer 305 may comprise tungsten, tungsten nitride, tungsten carbide, tungsten silicide, tantalum silicide, tantalum nitride, tantalum silicon nitride, tantalum carbide, molybdenum, molybdenum silicide, niobium silicide, molybdenum carbide, ruthenium, or ruthenium carbide. Other metal combinations known to those who are skilled in the art are also within the scope of the present invention. The metal layer 305 is preferably selected such that the work function of the metal layer 305 can be appropriately modified to the conduction band or the valence band of the microelectronic substrate 105, depending on whether the intended device is an nMOS device or a pMOS device, respectively. The way in which the work function can be modified to the conduction band or valence band is explained below in more detail.

Figure 3B:
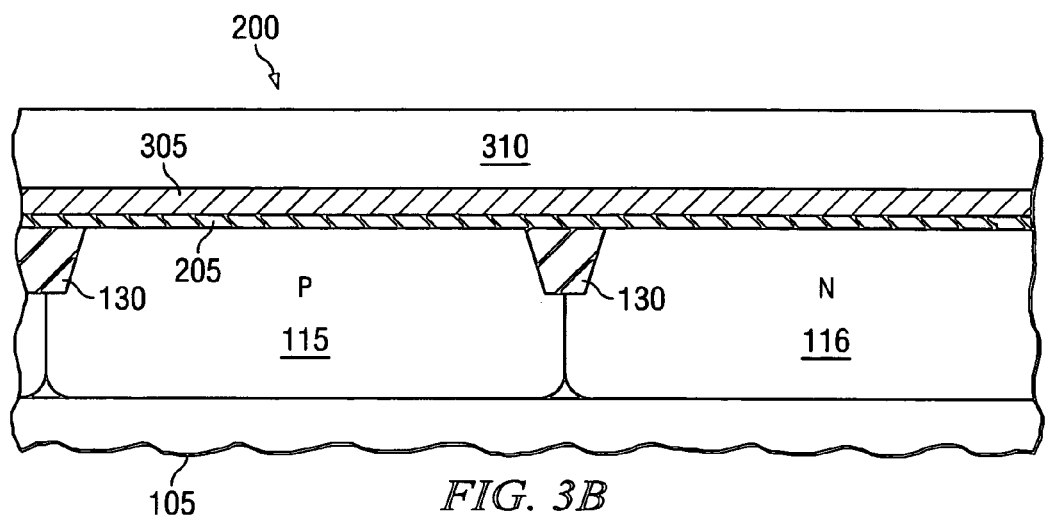
FIG. 3B illustrates a partial, sectional view of the microelectronics device of FIG. 3A after the formation of a sacrificial layer over the metal layer.

Turning now to FIG. 3B, a partial, sectional view of the microelectronics device 200 of FIG. 3A is shown after the conventional formation of a sacrificial gate layer 310, also known as a dummy gate layer, over the metal layer 305. The sacrificial gate layer 310 may be comprised of a number of materials. Polysilicon may be used in an exemplary embodiment, but in other embodiments, the sacrificial gate layer 310 may be comprised of silicon nitride, silicon dioxide, silicon carbide, or silicon germanium to name just a few. However, consideration must be given to the material chosen for the sacrificial gate layer 310 because in certain instances, the silicon in the sacrificial gate layer 310 may react with the underlying metal layer 305. If the metal layer 305 does interact with the material of the sacrificial gate layer 310, an optional barrier layer, which is not shown, can be deposited to prevent the interaction between the materials. Alternatively, the sacrificial layer 310 or the metal layer 305 is chosen so that they do no interact with each other. One example would be to have the metal layer 305 be tungsten silicide which is not highly reactive with silicon. Another is where the metal layer 305 is tungsten and the sacrificial layer 310 is silicon nitride, silicon dioxide, or silicon carbide. In such embodiments, it is preferred that the gate dielectric 205 be comprised of an oxynitride or hafnium silicon oxynitride.

In other embodiments, the material chosen for the sacrificial gate layer 310 may influence the selected composition of any sidewall spacers that might be present in the device, inasmuch as the etch used to remove the sacrificial gate layer 310 should be selective to the sidewall spacers; that is the etch should remove the sacrificial gate layer 310 at a much higher rate than the surrounding material. For example, in those instances where the sacrificial layer 310 is silicon nitride, the sidewall spacers may comprise silicon nitride and carbon, since this material etches much slower than other forms of silicon nitride.

Figure 3C:
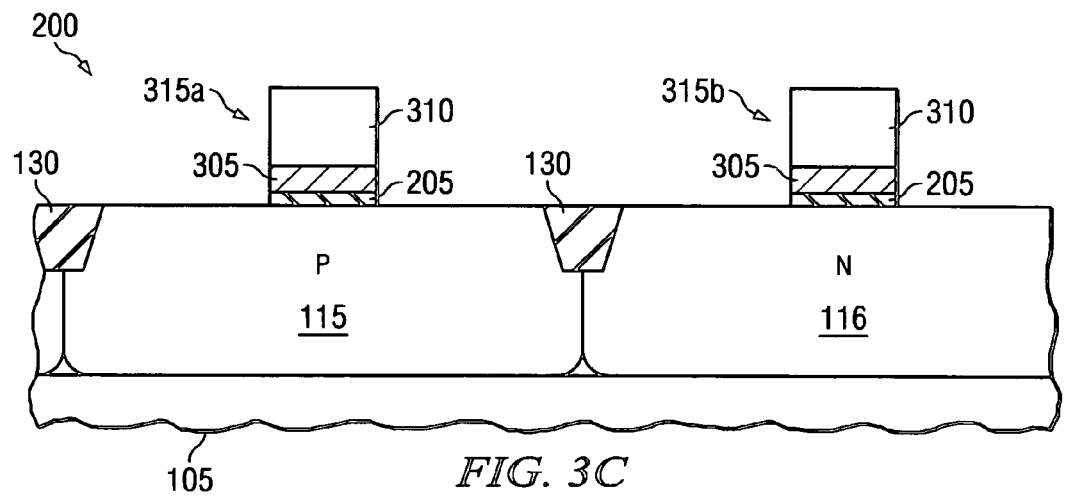
FIG. 3C illustrates a partial, sectional view of the microelectronics device of FIG. 3B after the patterning of the gate dielectric, the metal layer, and the sacrificial layer to form nMOS and pMOS stacked gate structures.

Referring now briefly to FIG. 3C, there is illustrated a partial, sectional view of the microelectronics device 200 of FIG. 3B following a conventional lithographic patterning of the gate dielectric 205, the metal layer 305 and the sacrificial layer 310 to form an nMOS stacked gate structure 315a over the nMOS well 115 and a pMOS stacked gate structure 315b over the pMOS well 116.

Figure 4A:
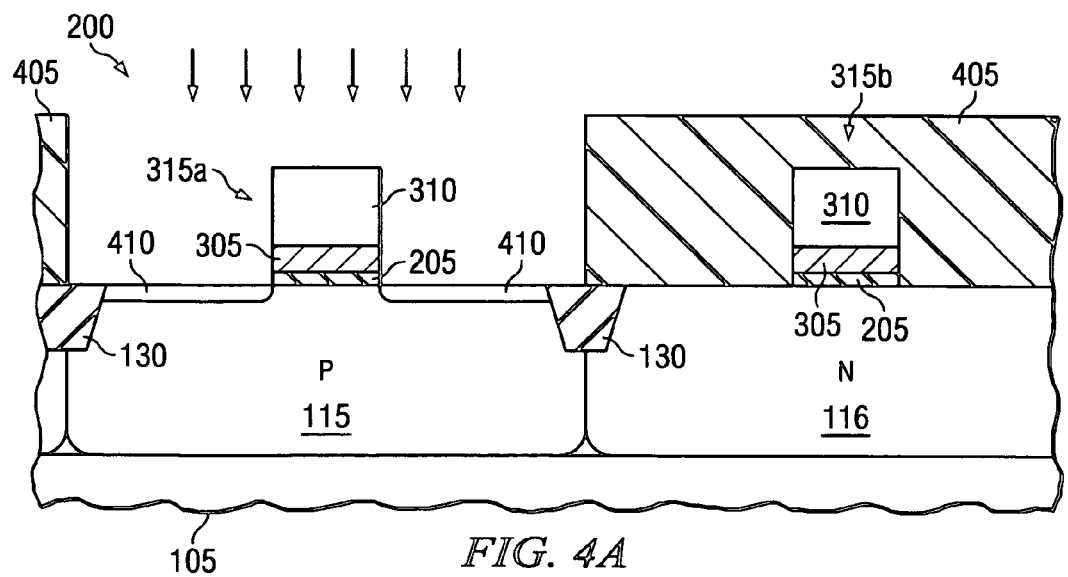
FIGS. 4A-4B illustrate partial sectional views of the partially completed microelectronics device of FIG. 3C showing the formation of lightly doped or medium doped regions adjacent the stacked gate structures.

Turning now to FIG. 4A, there is illustrated a partial, sectional view of the microelectronics device 200 of FIG. 3D following the deposition and patterning of an implant mask 405 and implantation of a lightly doped (LLD) or medium doped (MDD) nMOS source/drains 410 in the P well 115. The LDD or MDD source/drains 410 are formed with conventional dopant profiles that generally have a peak dopant concentration ranging from about 1E19 atoms/cm$^3$ to about 2E20 atoms/cm$^3$. As is standard in the industry, the LDD or MDD nMOS source/drains 410 have a dopant type opposite to that of the well region 115 in which they are located and can be formed using conventional implantation process that are well known to those skilled in the art. Upon completion of the formation of the LDD or MDD nMOS source/drains 410, the implant mask is conventionally removed and the microelectronics device 200 is cleaned.

Figure 4B:
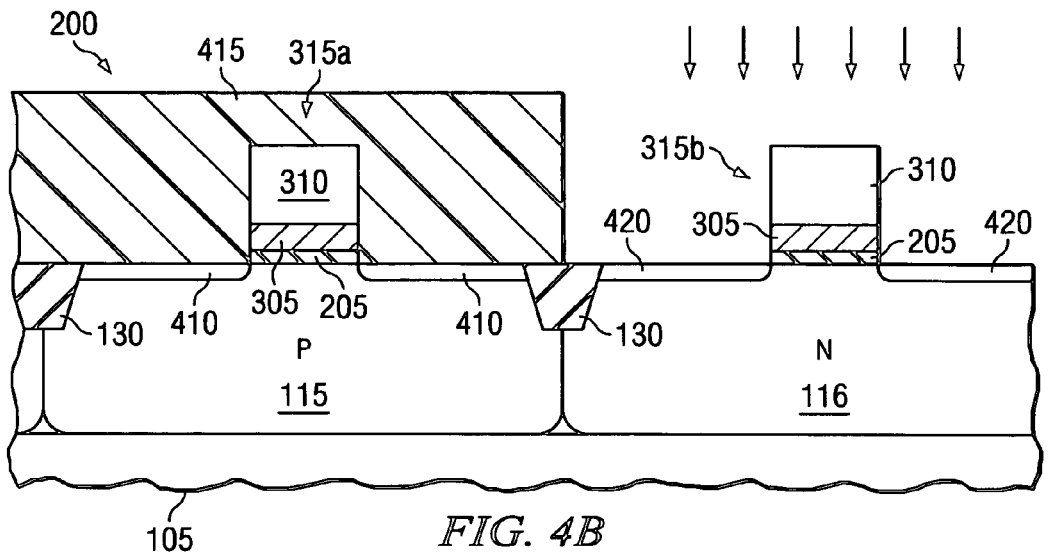

FIG. 4B, illustrates a partial, sectional view of the microelectronics device 200 of FIG. 4A following the formation of the LDD or MDD nMOS source/drains 410 and after the deposition and patterning of an implant mask 415 and implantation of a LDD or MDD pMOS source/drains 420 in the N well 116. Some embodiments may use a thin spacer layer or "offset" spacer to physically separate or offset the LDD dopants from the gate edge 310 to account for lateral diffusion of the LDD under the gate edge 310. The offset spacer is often made of silicon nitride. After the LDD implants an anneal is typically conducted primarily to remove damage and reduce transient enhanced diffusion that would occur during subsequent, moderate temperature, processing, such as further sidewall film deposition. A characteristic temperature for this RTP anneal is 950 degrees Celsius.

In an exemplary embodiment, the LDD or MDD pMOS source/drains 420 are formed with conventional dopant profiles that generally have a peak dopant concentration ranging from about 1E19 atoms/cm$^3$ to about 2E20 atoms/cm$^3$. As is standard in the industry, the LDD or MDD pMOS source/drains 420 have a dopant type opposite to that of the well region 116 in which they are located and can be formed using conventional implantation process that are well known to those skilled in the art. Upon completion of the formation of LDD or MDD pMOS source/drains 420, the implant mask is conventionally removed and the microelectronics device 200 is cleaned.

Figure 5A:
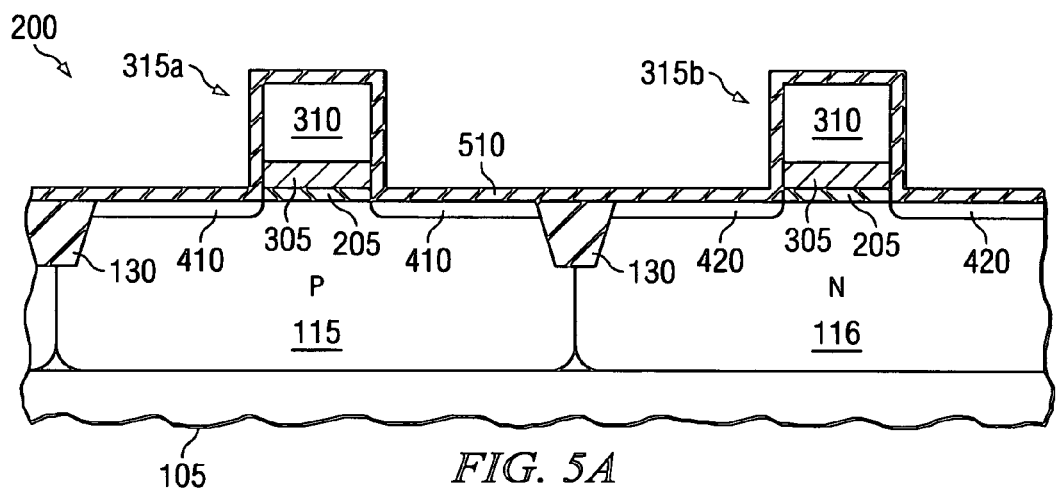
FIGS. 5A-5D illustrate partial sectional views of the partially completed microelectronics device of FIG. 4B showing the formation of sidewall spacers adjacent the stacked gate structures.

After the formation of the nMOS and pMOS source drains 410 and 420, conventional processes and materials are used to form sidewall spacers adjacent each of the stacked gate structures 310. In one embodiment, this process comprises forming an oxide 510 over the microelectronics device 200 of FIG. 4B, as shown in FIG. 5A. Conventional processes, such as oxidation, chemical vapor deposition, or atomic layer deposition may be used to form the oxide layer 510. The thickness of the oxide layer 510 may vary. For example, its thickness can range from about 10 nm to about 300 nm, but in one advantageous embodiment, the thickness may be about 15 nm.

Figure 5B:
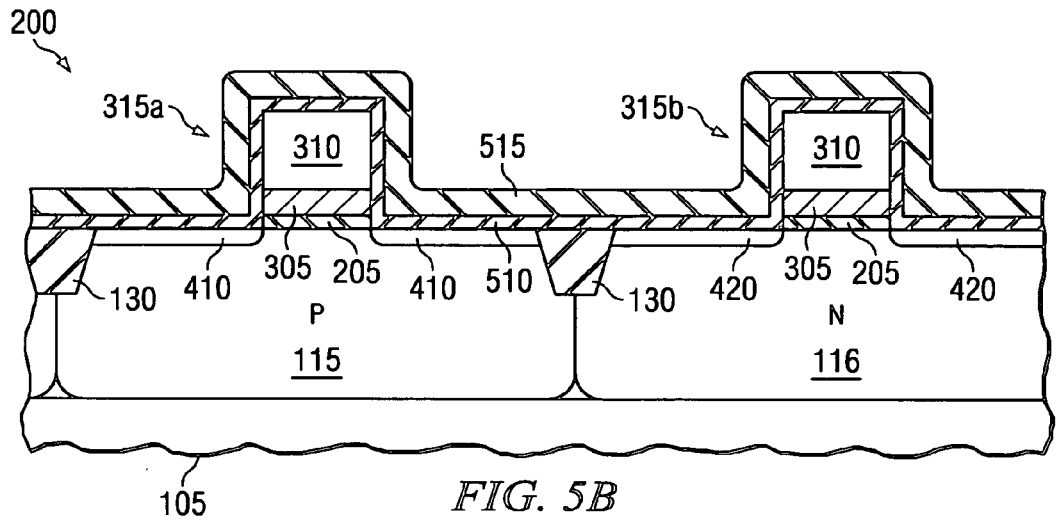

After formation of the oxide 510, a nitride layer 515 is conventionally deposited over the microelectronics device 200, as depicted in FIG. 5B. The nitride layer 515 may comprise a standard silicon nitride, or in some embodiments, the silicon nitride layer 515 may also comprise carbon therein for the purposed stated above. If the nitride layer 515 were to contain the carbon, the carbon might form from about 5% to about 10% of the layer. The thickness of the nitride layer 515 may also vary, depending on design. However, in an advantageous embodiment, the nitride layer 515 has a thickness of about 80 nm and is deposited using a silane and ammonia gas mixture.

Figure 5C:
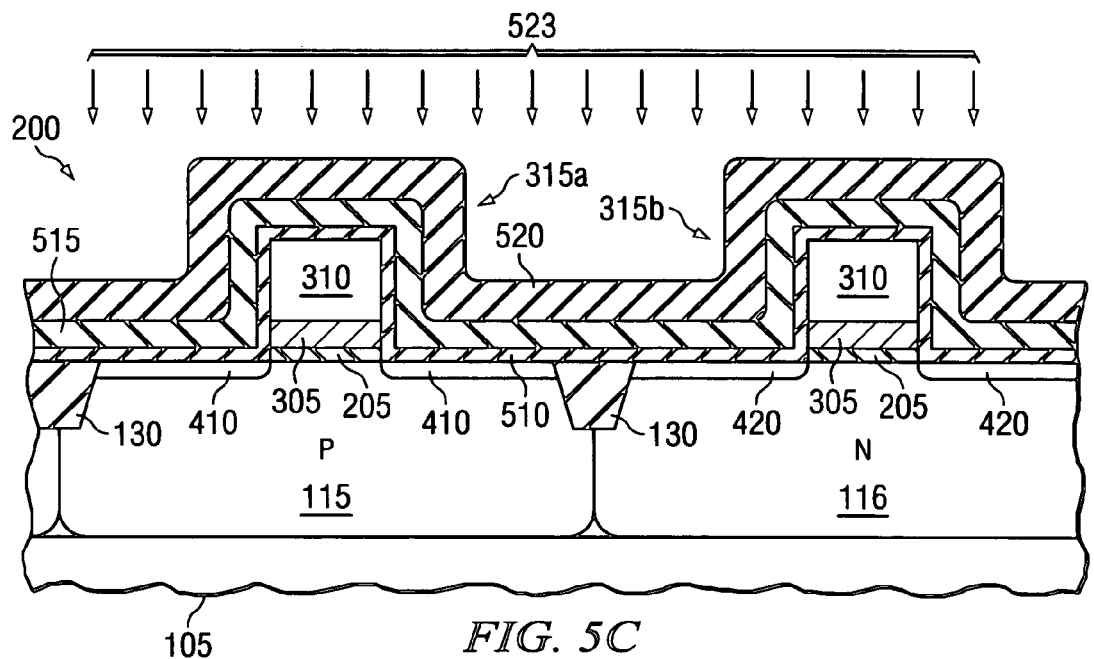

Referring briefly now to FIG. 5C, there is shown a sectional view of the partially completed microelectronics device 200 illustrated in FIG. 5B after the conventional deposition of an oxide layer 520. The oxide layer 520 is blanket deposited over the nitride layer 515, and its thickness may range from about 20 nm to about 150 nm. A conventional anisotropic etch 523 is then conducted that etches the pad oxide layer 510, the nitride layer 515 and the oxide layer 520 to form the structure seen in FIG. 5D.

Figure 5D:
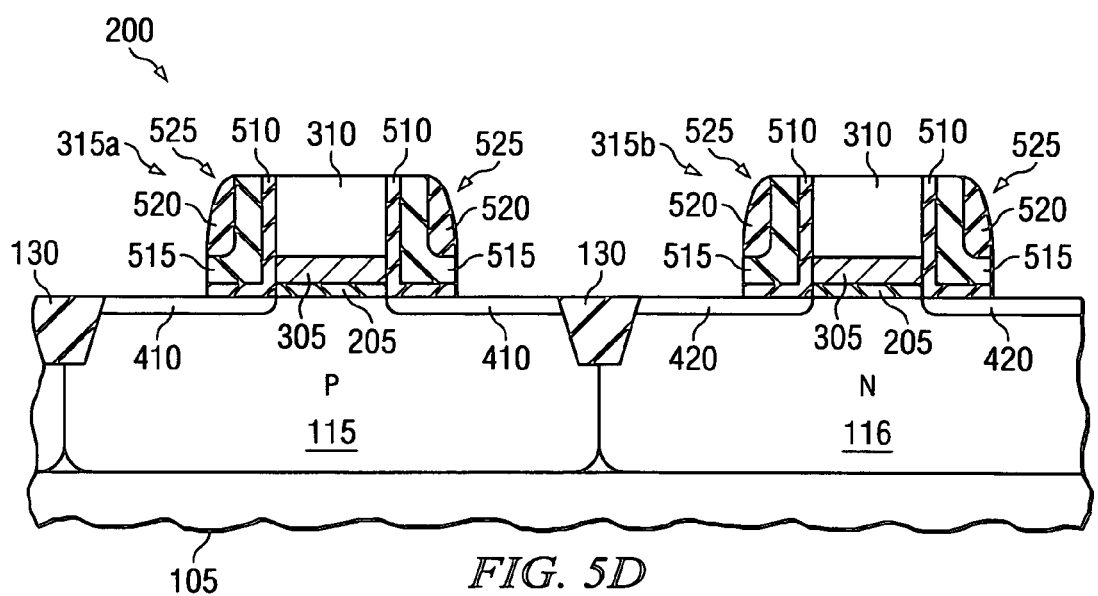

FIG. 5D illustrates the microelectronics device 200 of FIG. 5D after the conventional anisotropic etch 523 of FIG. 5C is conducted to form sidewall spacers 525 from the layers discussed above. While only three different layers have been illustrated and discussed in the foregoing embodiments, it should be understood that the number of layers may vary, and certain embodiments, may include more than three layers or less than three layers. The sidewall spacers 525 may be comprised of various compositions other than those discussed above. Moreover, as discussed above, it should also be understood that the selection of materials that comprises the sidewall spacers 525 may depend on the type of material of which the sacrificial gate layer 310 is comprised to provide enough of a difference so that the sacrificial layer 310 may be selectively etched.

With the sidewall spacers 525 formed, an implant mask 530 is conventionally deposited and appropriately patterned, and a conventional source/drain implant 534 is conducted to implant the deep nMOS source/drains 535 as seen in FIG.

Figure 6A:
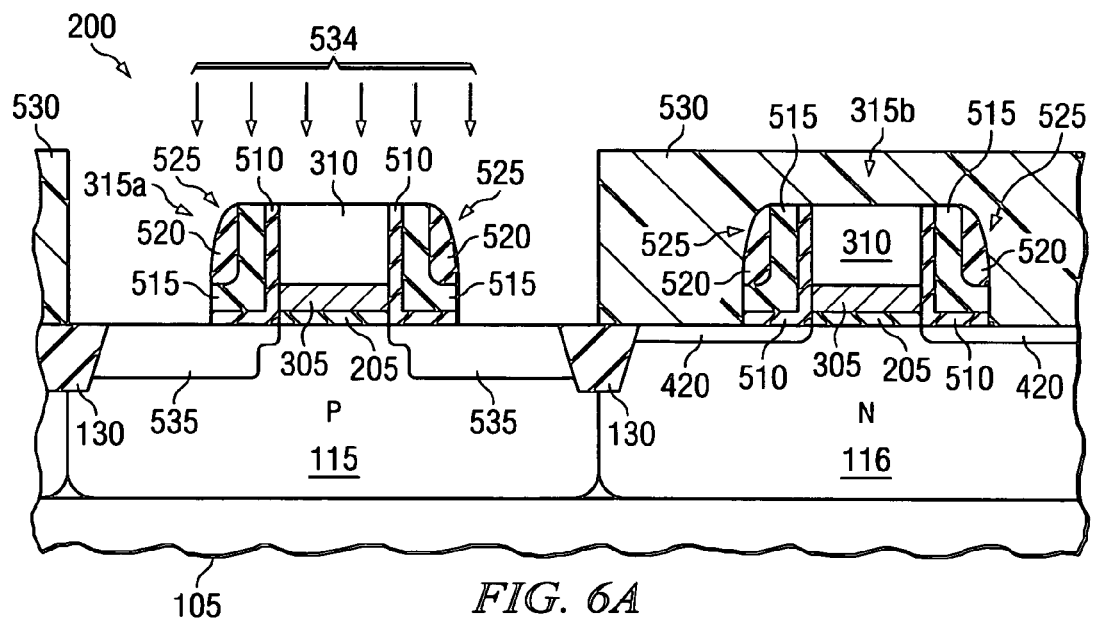
FIGS. 6A-6C illustrate partial sectional views of the partially completed microelectronics device of FIG. 5D showing the formation of deep source/drains adjacent the stacked gate structures.
Figure 6B:
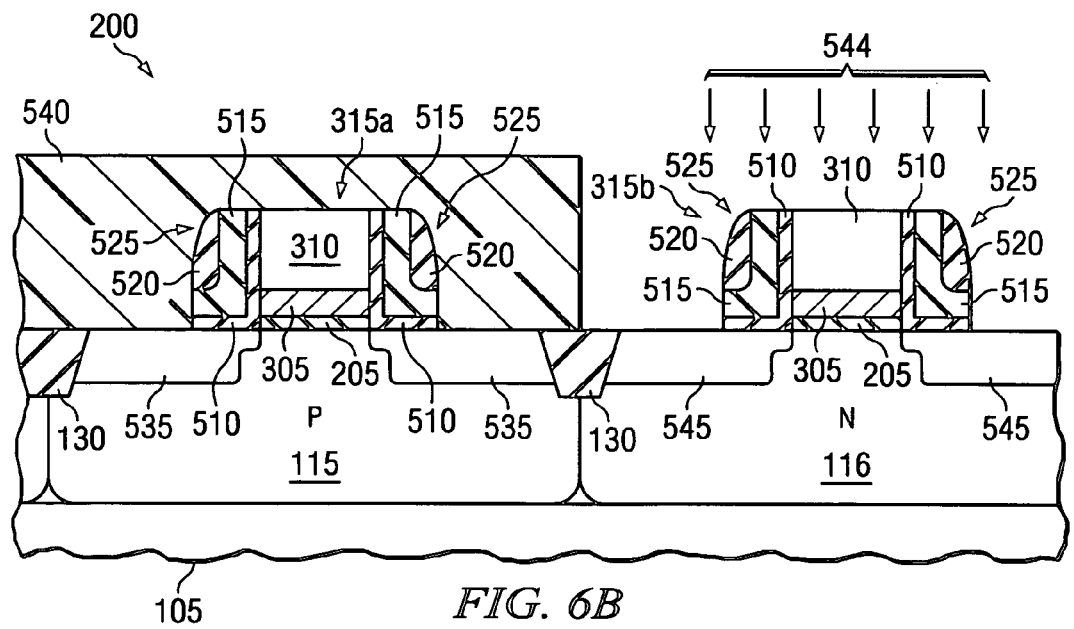

6A. The sidewall spacers 525 provide the appropriate off-set from the nMOS stacked gate structure 315a for the formation of the nMOS source/drains 535. Following this, implant mask 530 is conventionally removed, the microelectronics device 200 is cleaned, and another implant mask 540 is conventionally deposited and appropriately patterned to expose the N-well 116 to a source/drain implant, as illustrated in FIG. 6B. A conventional source/drain implant 544 is again conducted to implant the deep pMOS source/drains 545. The sidewall spacer 525 provides the appropriate off-set from the stacked gate structure 315b for the formation of the pMOS source/drains 545. The implant mask 540 is then conventionally removed and the microelectronics device 200 is cleaned, which results in the partially completed microelectronics device 200 depicted in FIG. 6C. The source/drains 535 and 545 may be activated by way of a conventional activation anneal, which is typically conducted at temperatures well in excess of about 700 degrees Celsius (e.g. around 1050 degrees Celsius). The gate dielectric is also subjected to a high temperature anneal prior to deposition of the first metal, ranging from about 700 degrees Celsius to about 1150 degrees Celsius, which ensures that the silicon-dielectric interface is of high quality.

Figure 6C:
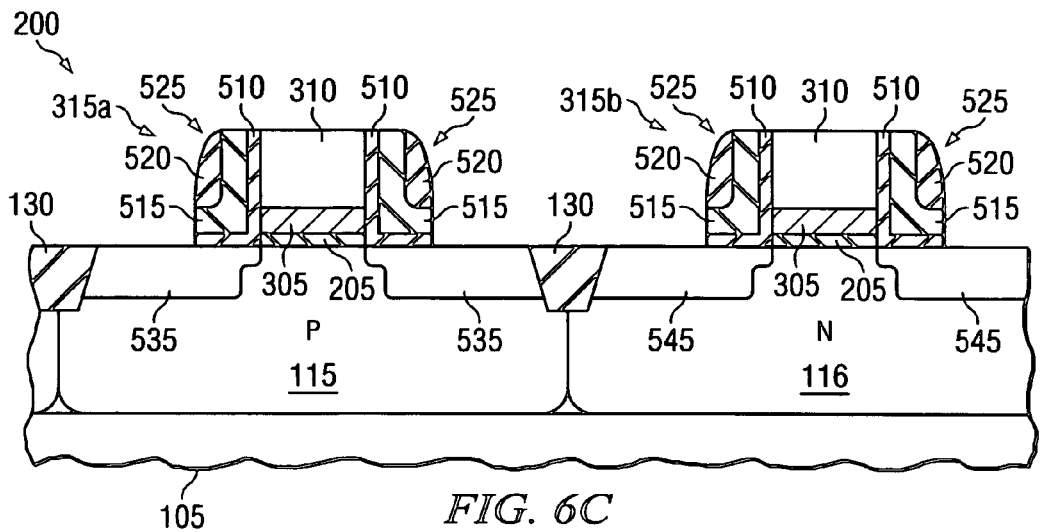
Figure 7A:
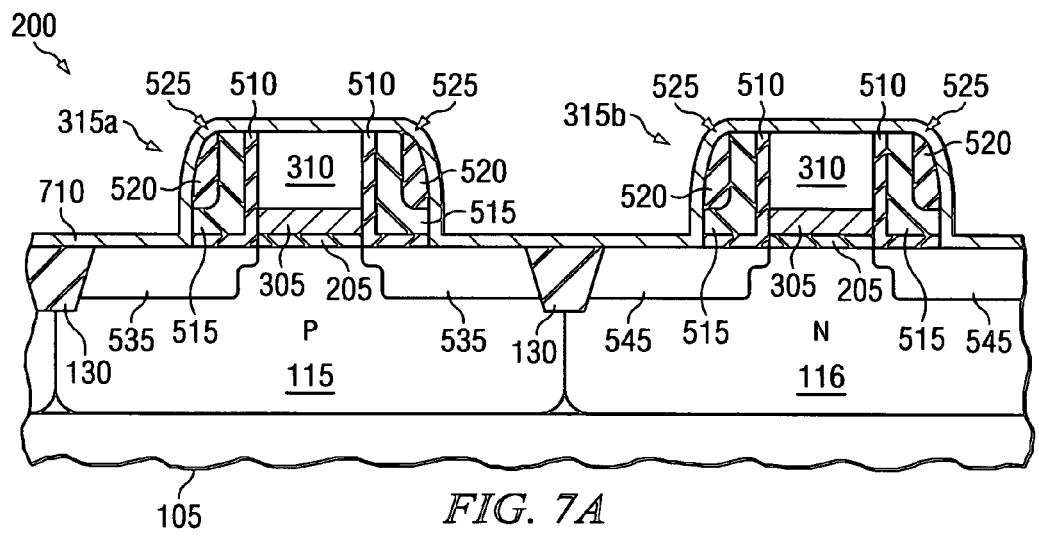
FIGS. 7A-7B illustrate partial sectional views of the partially completed microelectronics device of FIG. 6C showing the formation of silicided contacts adjacent the stacked gate structures.
Figure 7B:
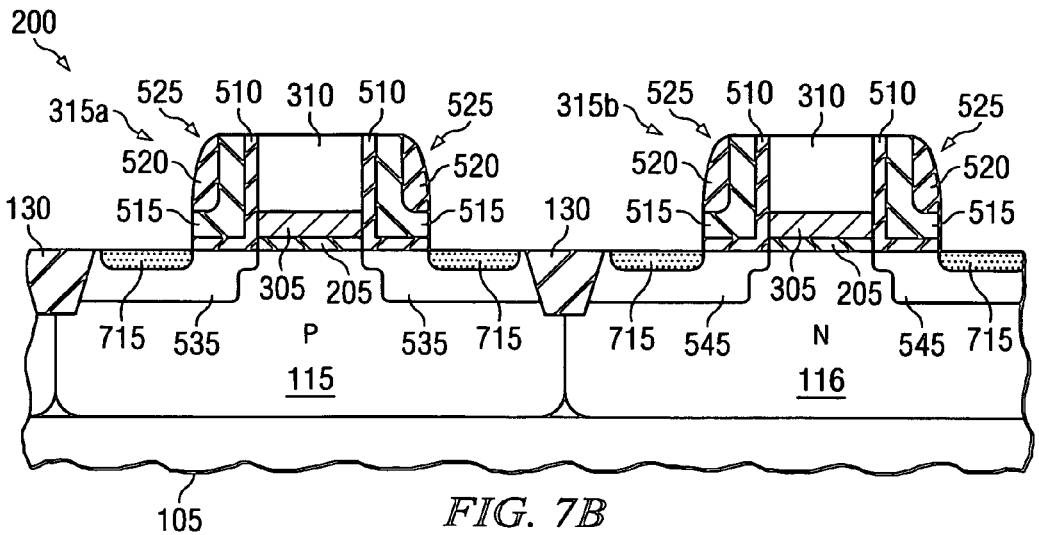

Turning now to FIG. 7A-7B, there is illustrated the microelectronics device 200 of FIG. 6C, after the conventional blanket deposition of a metal layer 710, such as nickel or other metal or alloys that can be used to form contacts 715 for the source/drains 535 and 545. In this embodiment, the contacts 715 may be formed prior to the removal of the sacrificial layer 310, or in other embodiments and when the silicidation temperatures are low enough, the contacts 715 may be formed after the sacrificial layer 310 is removed. This later embodiment may be where nickel is used as the silicidation metal, since it has a comparatively low thermal budget associated with its silicidation. The metal layer 710 is then subjected to a conventional anneal that causes a portion of the metal layer 710 to form a silicide with the silicon in the source/drains 535 and 545. The excess is conventionally removed, resulting in contacts 715 as shown in the partially completed microelectronics structure 200 of FIG. 7B.

Figure 8A:
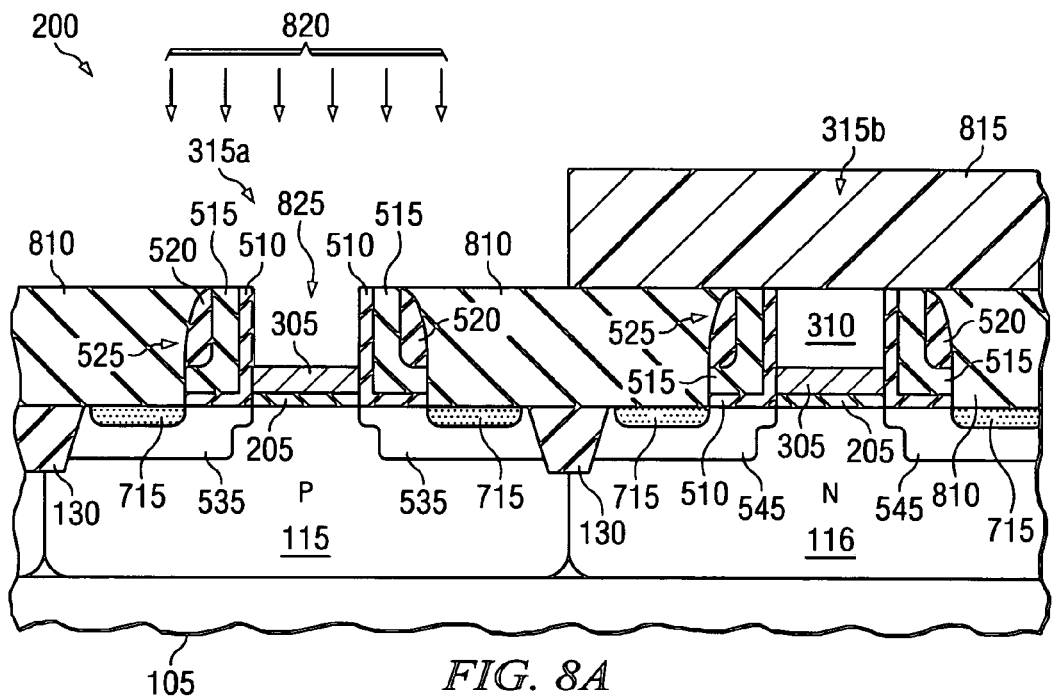
FIGS. 8A-8F illustrate partial sectional views of the partially completed microelectronics device of FIG. 7B showing the formation of a metal gate electrode having a modified work function in the nMOS stacked gate structure.
Figure 8B:
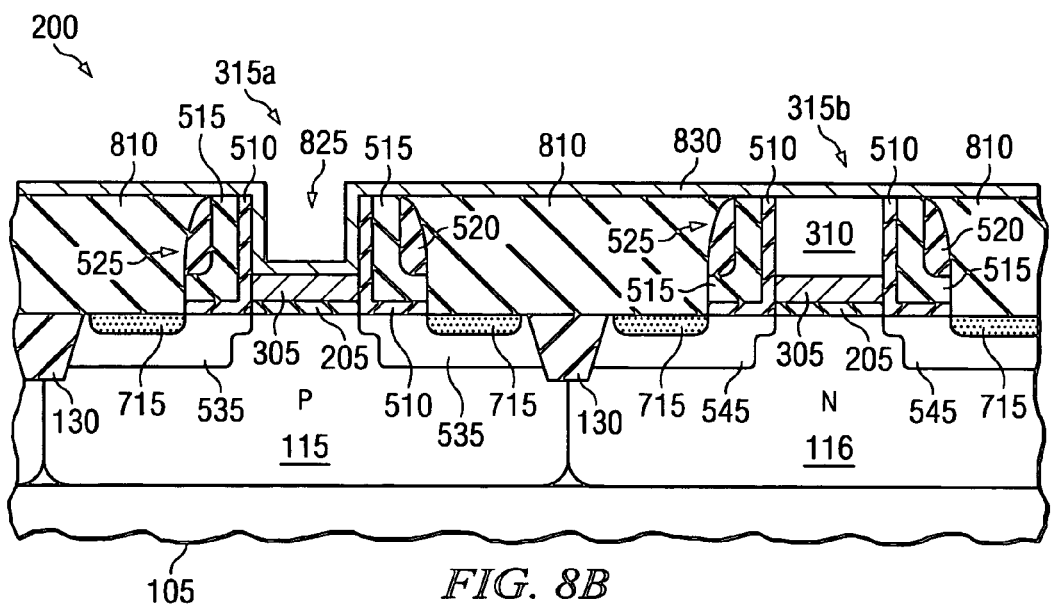

Referring now to FIG. 8A, there is illustrated the partially completed microelectronics device 200 of FIG. 7B after the removal of the sacrificial layer 310 from the nMOS stacked gate structure 315a. This step of manufacture also shows a pre-metal dielectric layer 810 that has been conventionally deposited over the stacked gate structures 315a and 315b and planarized. At this stage of manufacture, an etch mask 815, such as a conventional photoresist, is deposited and patterned to expose the nMOS stacked gate structure 315a. With the pMOS stacked gate structure 315b protected by the etch mask 815. A conventional etch 820 is then conducted to remove the sacrificial layer 310 from the nMOS stacked gate structure 315a to form an nMOS gate opening 825. The etch 820 that is used will depend on the type of material from which the sacrificial layer 310 is formed. For example, where the sacrificial layer 310 is polysilicon, the etch 820 may be tri-methyl ammonium hydroxide or ammonium hydroxide. Alternatively, in another embodiment where the sacrificial layer 310 is silicon dioxide or silicon nitride, the etch 820 may be hydrofluoric acid for oxide or phosphoric acid for nitride. As noted above, the etch 820 should remove the sacrificial layer 310 but leave the other layers substantially intact. After the removal of the sacrificial layer 310, the etch mask 815 is conventionally removed, and the microelectronics device 200 is cleaned. Following the cleaning steps, a metal layer 830 is conventionally formed over the metal layer 305 and the surface of microelectronics device 200 and within the nMOS gate opening 825, as illustrated in FIG. 8B. Exemplary processes that can be used to form the metal layer 830 include atomic layer deposition, plasma vapor deposition, chemical vapor deposition, or other deposition process know to those who are skilled in the art. During its formation over the metal layer 305, the metal layer 830 may be formed directly on the metal layer 305. Alternatively, there may be an intervening layer or layers located between the metal layer 305 and the metal layer 830 within the nMOS gate opening 825. The selection of the metal layer 830 will depend on the underlying metal layer 305, embodiments of which are set forth above, and will also depend on whether the device is to be an nMOS or a pMOS device. Preferably, the metal layer 830 has a different work function than the metal layer 305 and may be selected from a number of metals. By way of example only, if the device is to be an nMOS device, the metal chosen to form metal layer 830 may be vanadium, tantalum, niobium, titanium, zirconium, hafnium, scandium, yttrium, lanthanum, or ytterbium. Alloys of these metals may also be used in certain embodiments. In exemplary embodiments, however, the metal layer 305 is tungsten or tungsten silicide and metal layer 830 is tantalum or hafnium. An exemplary range of thickness for the metal layer 925 may be at least about 1 nm.

Figure 8C:
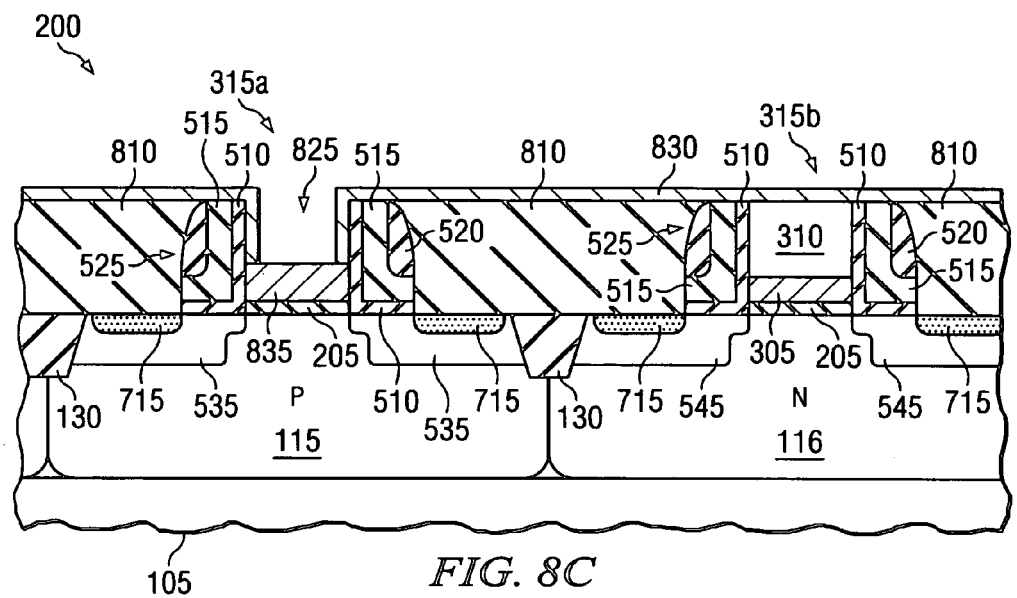

With reference now to FIG. 8C and continued reference to FIG. 8B, there is depicted a step in an exemplary method embodiment where an anneal is conducted following the deposition of the metal layer 830. In one embodiment, the anneal may be a forming gas anneal conducted at temperature of 700 degrees Celsius or less, and in an advantageous embodiment, the anneal is conducted at temperatures of around 400 degrees Celsius. The anneal modifies the work function of the metal layer 305 by incorporating a portion of the metal layer 830 into the metal layer 305 located within the nMOS gate opening 825. The incorporation of the metal layer 830 modifies the work function of metal layer 305 to the conduction band of the microelectronics substrate and forms an nMOS metal gate electrode 835. The conduction band of the nMOS metal gate electrode 835 will vary, depending on the substrate. In those embodiments where the substrate is silicon, the nMOS gate electrode's 835 work function is matched to a silicon substrate's conduction band when the gate work function is less than about 4.6 eV, and more preferably, from about 4.0 and to about 4.3 eV. Of course, if the substrate is other than silicon, the conduction band will be different, and those who are skilled in the art would understand how to make the necessary adjustments to match the appropriate conduction band.

In an alternative embodiment, however, the anneal may be conducted after the formation of an electrode contact, which is discussed below regarding FIG. 8D. In yet another embodiment, the anneal may even be deferred later in the process so that the nMOS and pMOS work functions can be simultaneously modified, as discussed below regarding FIGS. 10A-10B.

In an advantageous embodiment and during the anneal, it is believed that the metal layer 830 diffuses to near the interface of the metal layer 305 and the gate dielectric 205. The quality of the gate dielectric 205 is left substantially intact due to the presence of the metal layer 305, which acts to protect the gate dielectric 205 during these fabrications steps. This is very much in contrast to conventional gate last processes where the gate dielectric is subjected to etch processes or where the gate dielectric is removed altogether, either of which substantially affect the quality of the gate dielectric. Moreover due to the fact that the gate dielectric when removed then has to be grown at lower temperature than that used for the original gate dielectric layer, the reliability of the gate dielectric can be significantly affected.

In other embodiments, the work function of the metal layer 305 may be modified by diffusing dopants from the sacrificial layer 310 into the metal layer 305. In another embodiment, the work function of the metal layer 305 may be modified by implanting dopants directly into the metal layer 305 after the sacrificial layer has been removed, or by introducing the dopants into the deposition gas during the formation of the metal layer 305. As used here, a dopant is any element or compound of elements that will effect a change in or modify the work function of the metal layer 305 when incorporated therein. With the principles of the present invention realized, those who are skilled in the art would understand what dopants to select to achieve the desired work function and the conditions necessary to incorporate them into the metal layer 305.

Figure 8D:
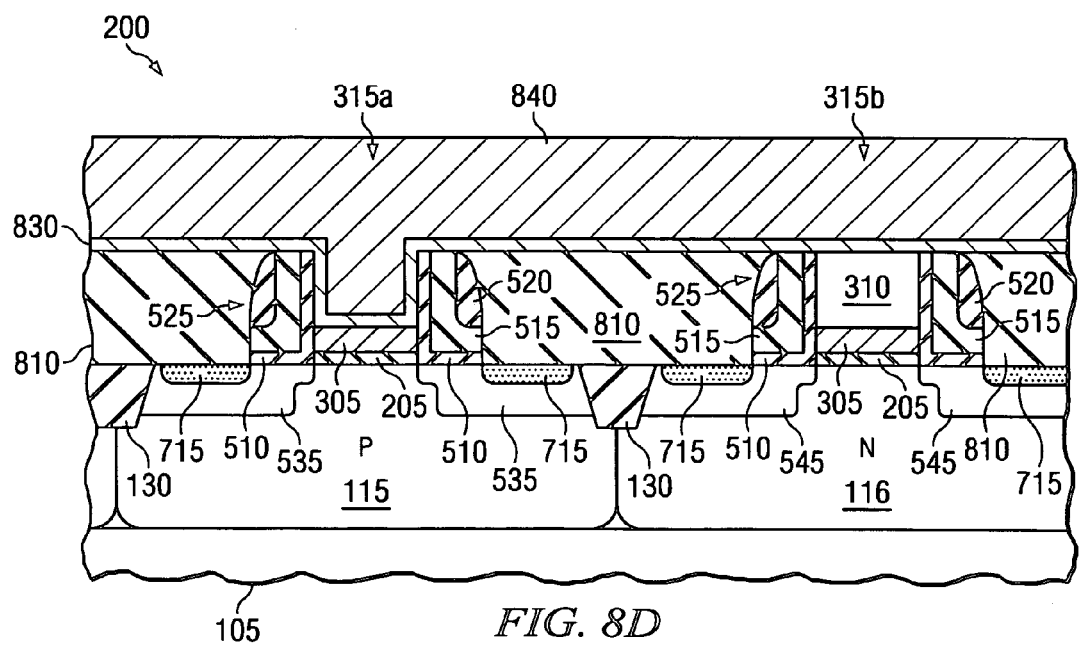

Referring now to FIG. 8D, there is illustrated a partial, sectional view of the microelectronics device 200 of FIG. 8B following the conventional deposition of a contact metal layer 840. The contact metal layer 840 may comprise any type of metal known to those who are skilled in the art that can be used as a contact metal for a gate electrode. For example, the contact metal layer 840 may be tungsten, aluminum, or copper and combinations or alloys thereof. Depending on the metals that are used for the various layers, it may be necessary to locate a barrier layer between the metal layer 830 and the contact metal layer 840 to prevent diffusion between the metal layer 830 and the contact metal layer 840. However, in advantageous embodiments, the metals are selected so that a barrier layer is not necessary.

Figure 8E:
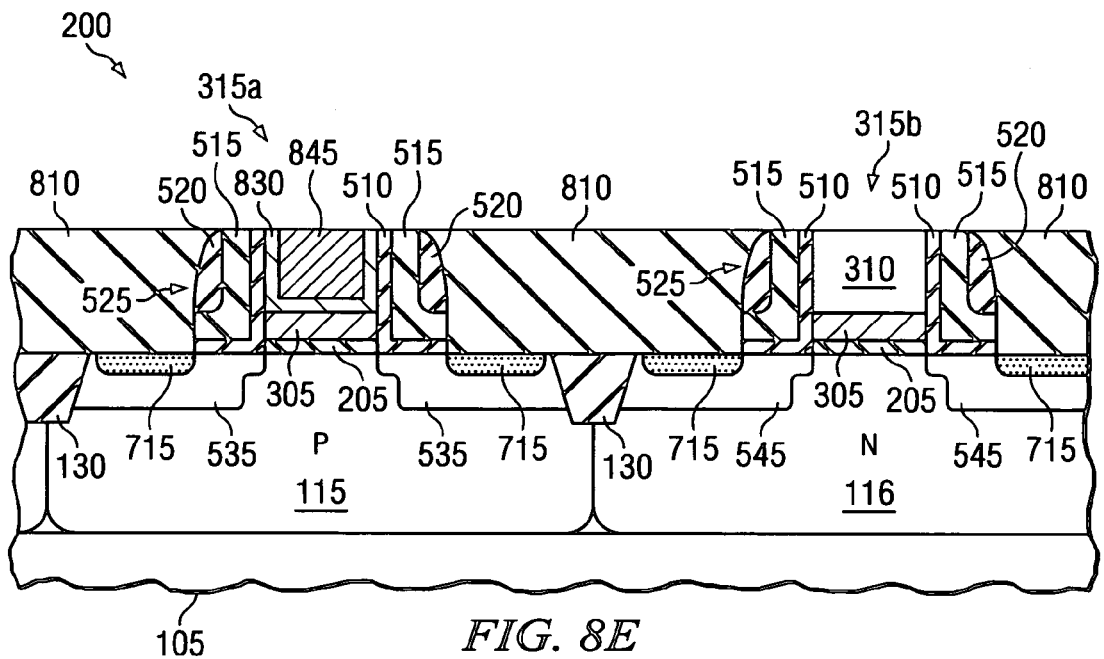

In the embodiment illustrated in FIG. 8D, the above-mentioned anneal has not been conducted. Thus, the work function of the metal layer 305 has not yet been modified and the gate electrode has not been formed. Following the deposition of the contact metal layer 840, a conventional planarization or other removal step may be conducted to remove the excess contact metal layer 840 and the metal layer 830 located on the upper surface or in the field of the microelectronics device 200. This results in an nMOS gate electrode contact 845 being formed as shown in FIG. 8E.

Figure 8F:
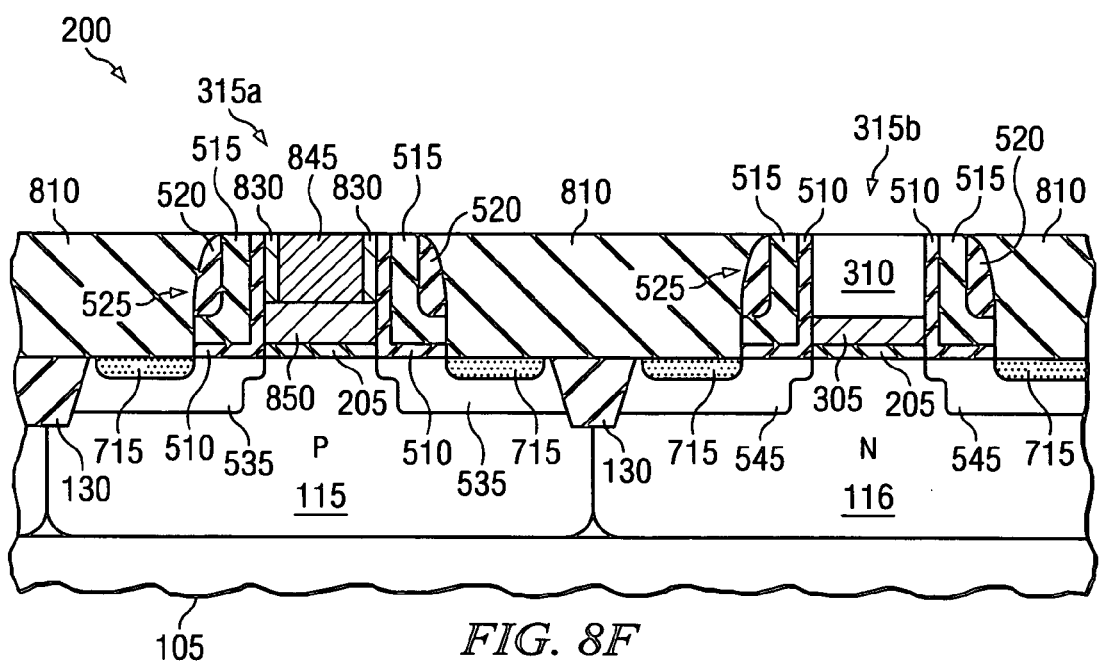

An anneal, such as the one described above with respect to FIG. 8C, can then be conducted, which forms an nMOS gate electrode 850, as shown in FIG. 8F. It should be understood that the anneal is but one way to modify the work function of the metal layer 305. The same alternative embodiments used to modify the work function of the metal layer 305 discussed above regarding FIG. 8C may also be used in lieu of the anneal. At this stage of manufacture of the illustrated embodiment, the pMOS gate has not been formed. Thus, with the nMOS gate electrode 850 having been formed, attention will now be turned to the formation of the pMOS gate electrode.

Figure 9A:
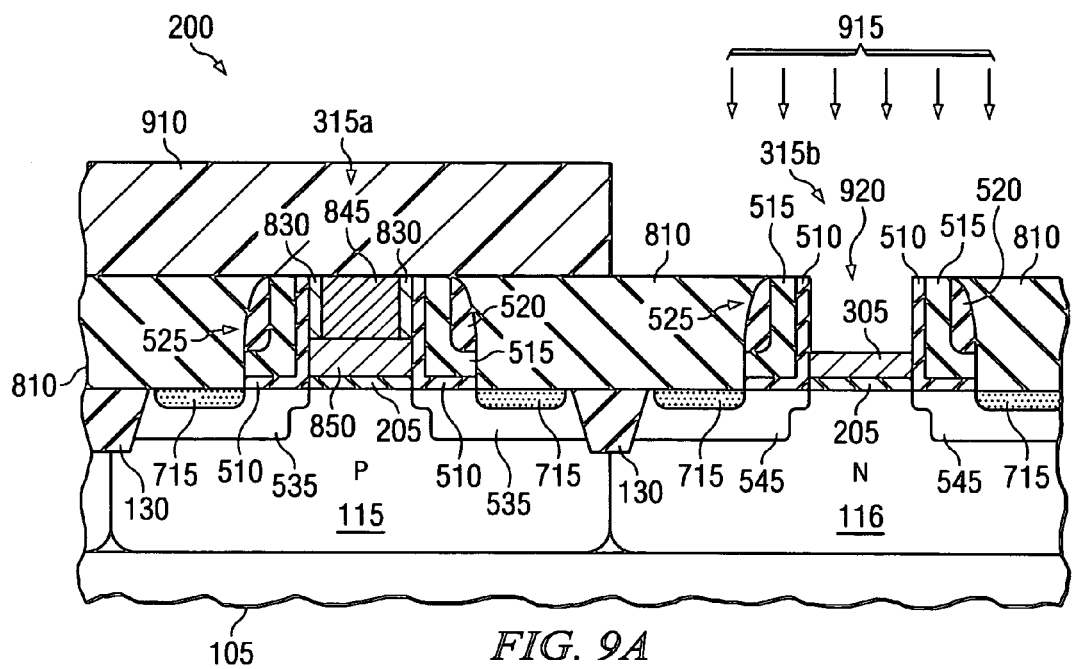
FIGS. 9A-9E illustrate partial sectional views of the partially completed microelectronics device of FIG. 8F showing the formation of a metal gate electrode having a modified work function in the pMOS stacked gate structure.

Referring initially to FIG. 9A, there is illustrated a partial sectional view of the microelectronics device 200 following the process described above regarding FIG. 8F. In this view, a conventional etch mask 910 has been deposited and patterned to expose the pMOS stacked gate structure 315b in a way similar or identical to that discussed above regarding FIG. 8A. With the nMOS stacked gate structure 315a protected by the etch mask 910, a conventional etch 915 is conducted to remove the sacrificial layer from the pMOS stacked gate structure 315b to form a pMOS gate opening 920. The etch 915 that is used is preferably the same as those discussed above regarding FIG. 8A, and in an advantageous embodiment, the etch 915 should remove the sacrificial layer 310 but leave other layers substantially intact, as also previously discussed.

Figure 9B:
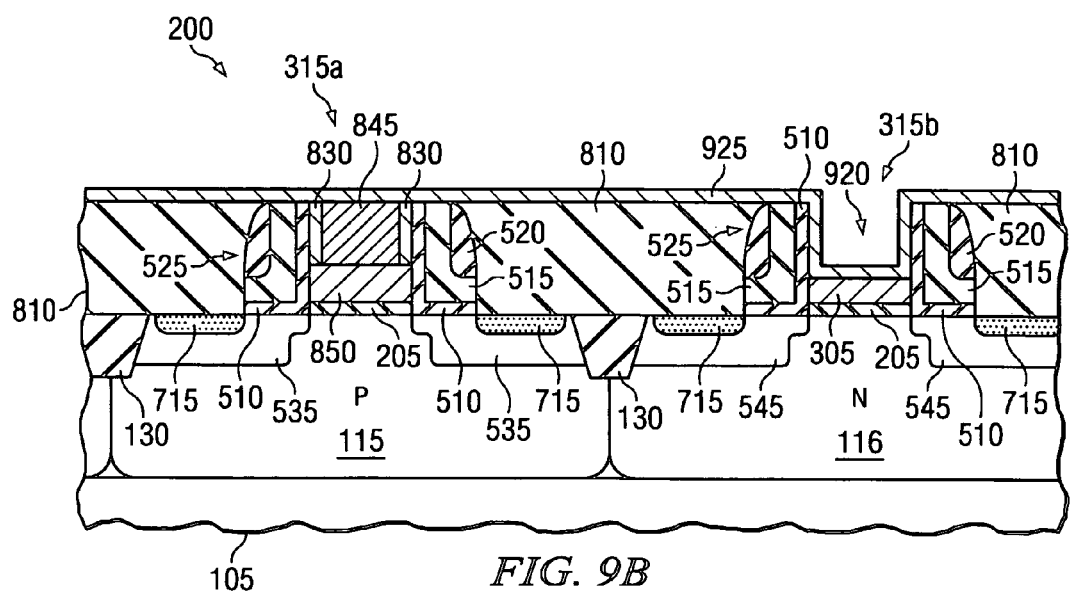

After the removal of the sacrificial layer 310 from the pMOS stacked gate structure 315b and the etch mask 815, the microelectronics device 200 is cleaned, and a metal layer 925 is conventionally formed over the metal layer 305 within the pMOS gate opening 920 and over the surface of microelectronics device 200, as illustrated in FIG. 9B. The same conventional process mentioned above regarding FIG. 8C may be used to form metal layer 925. The thickness of the metal layer 925 needs to be sufficient to adequately adjust the work function of the metal layer 305. An exemplary range of thickness for the metal layer 925 may be at least about 1 nm.

As the metal layer 925 is being formed over the metal layer 305, the metal layer 925 may be formed directly on the metal layer 305 or it may be formed on an intervening layer or layers located between the metal layer 305 and the metal layer 925 within the pMOS gate opening 925. As was the case with the nMOS device, the selection of the metal layer 925 will depend on the underlying metal layer 305, embodiments of which are set forth above, and whether the device is to be an nMOS or a pMOS. Preferably, the metal layer 925 has a different work function than the metal layer 305 and may be selected from a number of metals. By way of example only and since the device here is a pMOS device, the chosen metal may be platinum, iridium, nickel, cobalt, palladium, ruthenium, rhodium, or rhenium. Alloys of these metals may also be used in certain embodiments. In an advantageous embodiment, the metal layer 305 is tungsten or tungsten silicide, metal layer 830 is tantalum, and metal layer 925 is platinum.

Figure 9C:
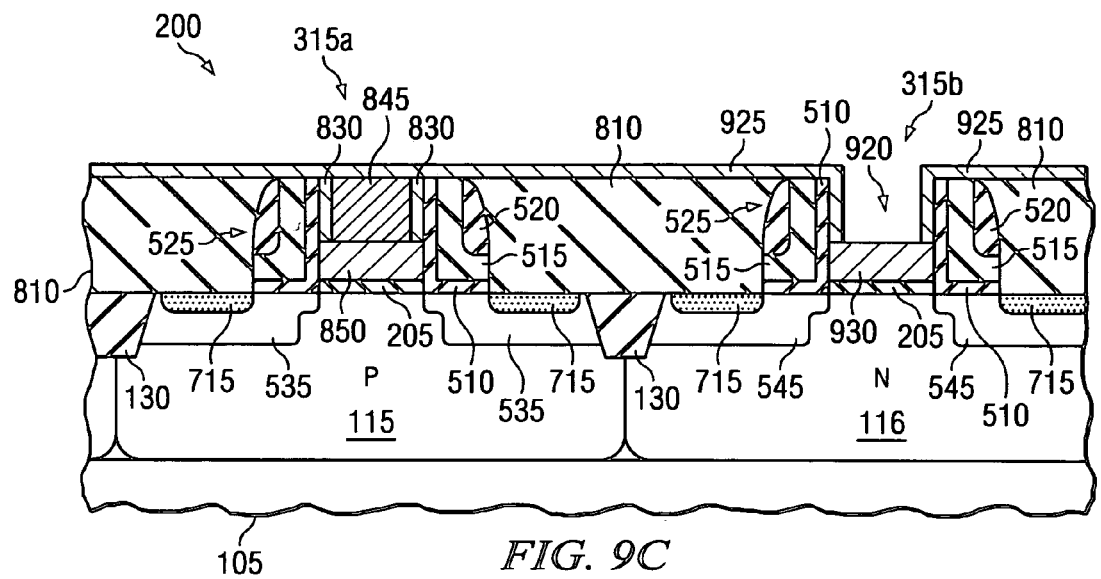

With reference now to FIG. 9C and continued reference to FIG. 9B, at this point, the same anneal as discussed above with respect to the formation of the nMOS gate electrode 850 may be conducted to modify the work function of the metal layer 305 by incorporating a portion of the metal layer 925 into the metal layer 305 that is located within the pMOS gate opening 920. The incorporation of the metal layer 925 modifies its work function to the valence band of the microelectronics substrate and forms a pMOS metal gate electrode 930. The valence band of the pMOS metal gate electrode 930 will vary, depending on the substrate. In those embodiments where the substrate is silicon, the pMOS gate's work function is matched to a silicon substrate's valence band when the gate work function is greater than about 4.8 eV, and more preferably, about 4.9 to about 5.2 eV. Of course, if the substrate is other than silicon, the valence band will be different. In an alternative embodiment, the above-described anneal may be conducted after the formation of the electrode contact. This embodiment is discussed below regarding FIG. 9D.

In an advantageous embodiment and during the anneal, again, it is believed that the metal layer 925 diffuses to near the interface of the metal layer 305 and the gate dielectric 205. The gate dielectric 205, however is protected from the fabrication process by the metal layer 305. Thus, the quality of the gate dielectric 205 is left substantially intact, which is in contrast to conventional processes.

The same alternative methods for modifying the work function of the metal layer 305 in the nMOS stacked gate structure 315a are also applicable to modifying the work function of the metal layer 305 in the pMOS stacked gate structure 315b.

Figure 9D:
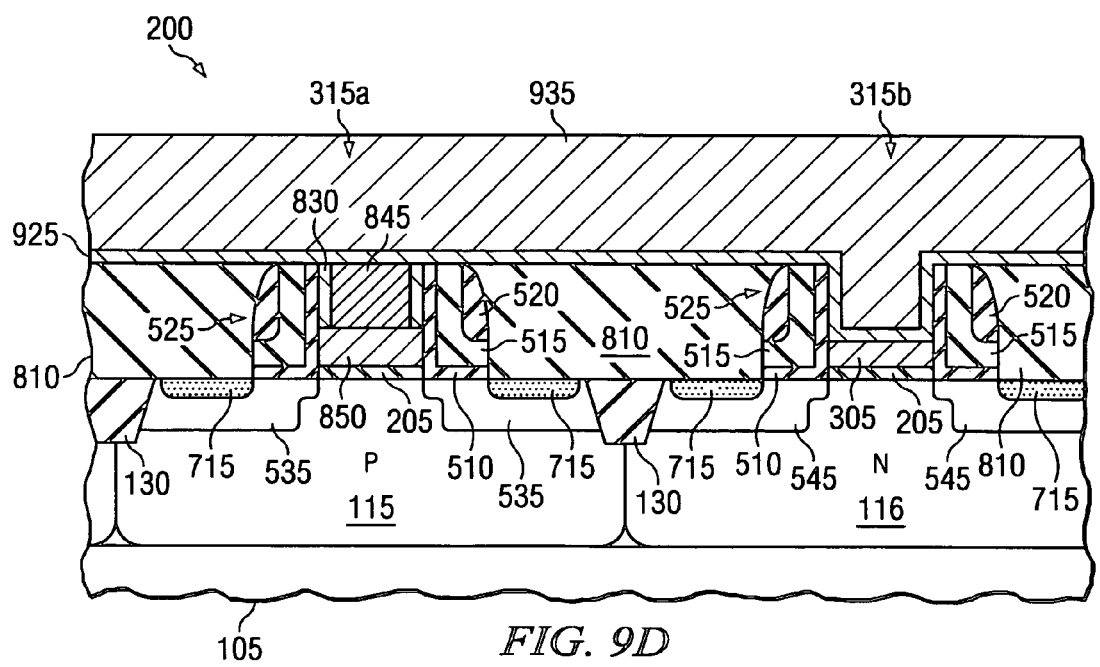

Referring now to FIG. 9D, there is illustrated a partial, sectional view of the microelectronics device 200 of FIG. 9B following the conventional deposition of a contact metal layer 935. The contact metal layer 935 may comprise any type of metal known to those who are skilled in the art that can be used as a contact metal for a gate electrode. For example, the contact metal layer 935 may be tungsten, aluminum or copper and including combinations or alloys thereof.

Depending on the metals that are used for the various layers, a barrier layer located between the metal layer 925 and the contact metal layer 935 may be necessary in certain embodiments to prevent diffusion between the contact metal layer 935 and metal layer 925. However, in advantageous embodiments, the metals are selected so that a barrier layer between these two metal layers is not necessary. In the illustrated embodiment of FIG. 9D, the anneal mentioned above regarding FIG. 9C has not yet been conducted. Thus, the work function of the metal layer 305 has not yet been modified.

Figure 9E:
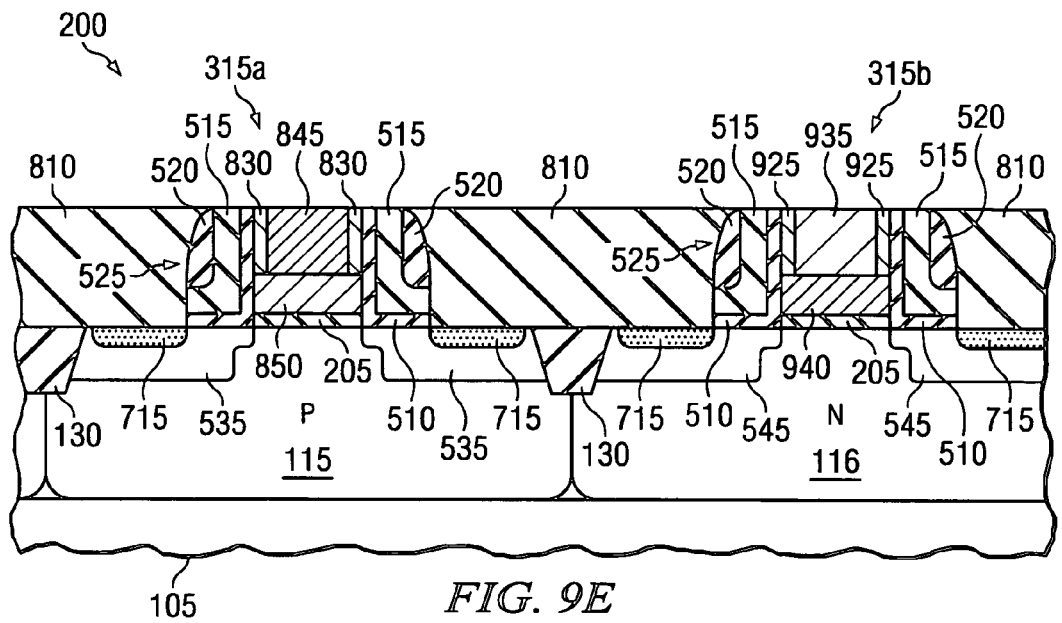

Following the deposition of the contact metal layer 935, a conventional planarization or other removal step may be conducted to remove the excess contact metal layer 935 and the metal layer 925 located on the upper surface or in the field of the microelectronics device 200, as shown in FIG. 9E.

An anneal, such as the one mentioned above with respect to FIG. 9C is conducted, which forms a pMOS gate electrode 940, as shown in FIG. 9E. It should be understood that the anneal is but one way to modify the work function of the metal layer 305. The same alternative embodiments used to modify the work function of the metal layer 305 mentioned above regarding FIG. 8C may also be used in lieu of the anneal.

Figure 10A:
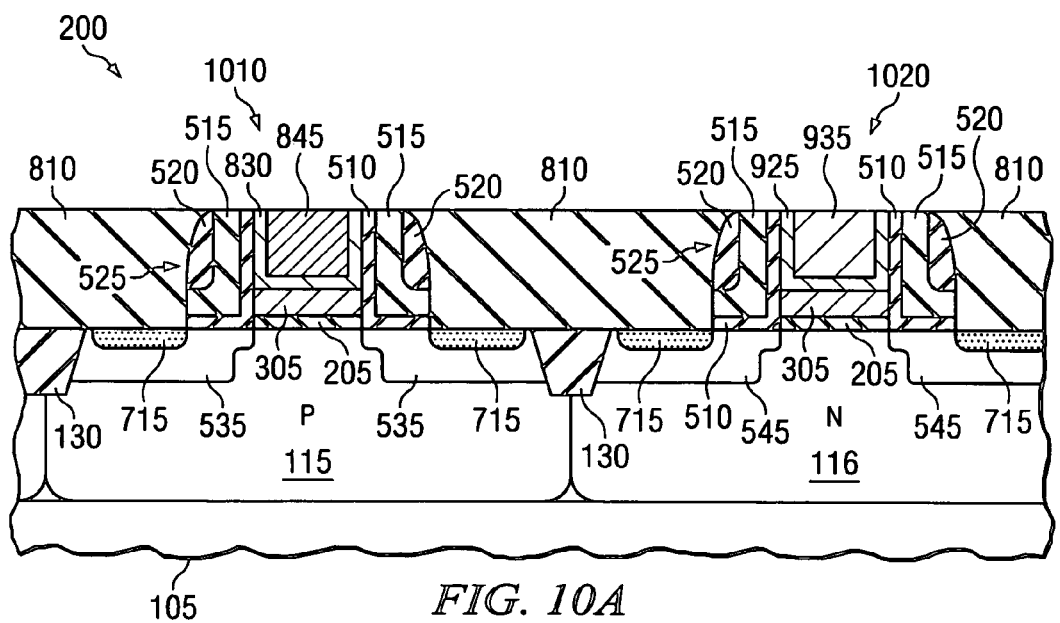
FIGS. 10A-10B illustrate partial sectional views of the partially completed microelectronics device of FIG. 7B showing the formation of a metal gate electrode having a modified work function in the nMOS stacked gate structure.
Figure 10B:
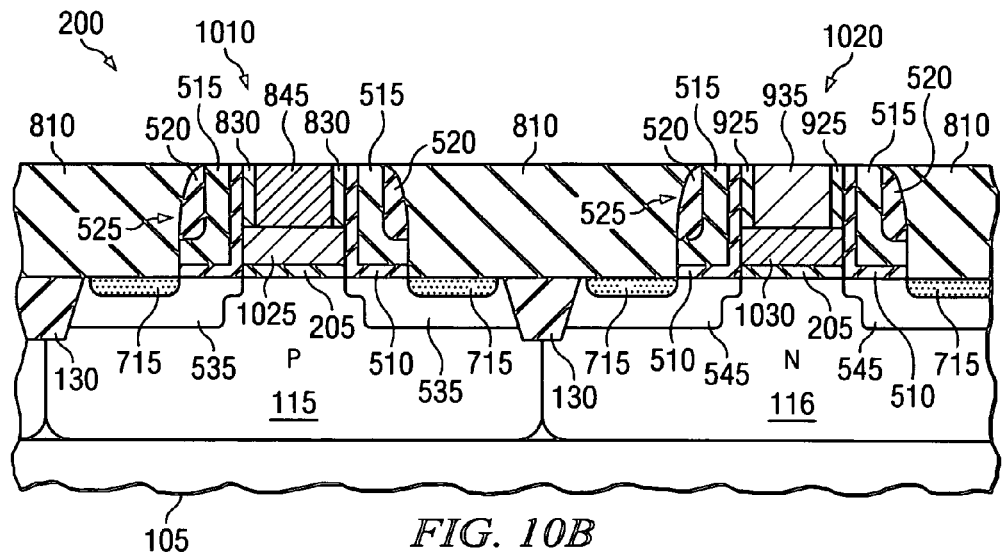

FIGS. 10A-10B show yet another embodiment of the microelectronics device 200 wherein the work function of neither the nMOS device 1010 nor the pMOS device 1020 has been modified. It has been mentioned above that the gate electrode formation and work function modification step of the nMOS device 1010 and pMOS device 1020 can be delayed until all of the various layers comprising the nMOS device 1010 and the pMOS device 1020 have been formed. As depicted in FIG. 10A, the nMOS device 1010 comprises the unmodified metal layer 305, the metal layer 830 and the contact metal layer 845. The pMOS device 1020 comprises the unmodified metal layer 305, the metal layer 925 and the contact metal layer 845, all of which may be fabricated as discussed above. Following the completion of the step to arrive at the microelectronics device 200, the above-discussed anneal or alternative processes may be conducted to modify the work functions of the metal layer 305 of the nMOS device 1010 and pMOS device 1020 form an nMOS gate electrode 1025 and pMOS gate electrode 1030 and to arrive at the structure shown in FIG. 10B.

Discussion will now be directed to another embodiment that is covered by the present invention. This embodiment is directed to a method comprising the steps shown in FIGS. 11A-11I. For clarity and continuity, the similar components that appear in the FIGS. 11A-11I are designated identically to those appearing in the foregoing embodiments. The new elements are designated with new numbers.

Figure 11A:
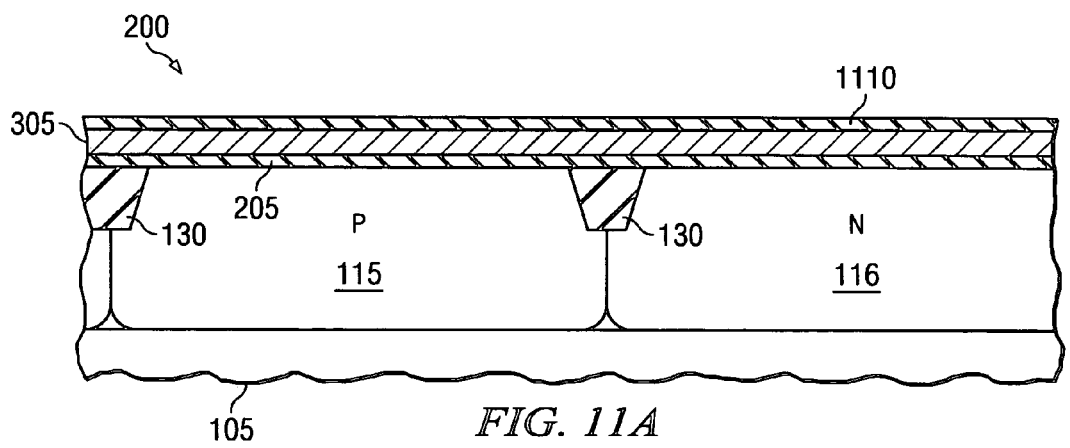
FIGS. 11A-11I illustrate partial sectional views of another embodiment of the microelectronics device that includes a barrier layer located between first and second metal layers.

In FIG. 11A, there is illustrated a partial sectional view of the microelectronics device 200 after the conventional deposition of a barrier layer 1110. Barrier layer 1110 is formed over metal layer 305 using conventional procedures. This embodiment is particularly useful when the metal layer 305 is comprised of a metal that has a work function already set for a pMOS device, and there is no need to modify the work function of the gate electrode for the pMOS device further.

An example of this type of metal is tungsten. In such instances, the nMOS gate electrode will still need to be modified in a manner as discussed above. Thus, the barrier layer 1110 is formed to prevent further modification of the metal layer 305 in the pMOS device.

Preferably, the barrier layer 1110 is composed of a material that deters the diffusion of any overlying metal into the metal layer 305. For instance, the barrier layer 1110 can decouple and prevent reactions between the metal layer 305 and the sacrificial layer 310 or any metal layer located over the metal layer 305 that can occur at elevated temperatures (e.g., greater than about 700° C.) associated with depositing such metal layers. Suitable barrier materials include metal nitride, metal carbide or metal boride. Other examples include tungsten nitride, tantalum nitride or titanium nitride. It is also desirable for the barrier layer 1110 to be thick enough to deter the diffusion into or the reaction with the metal layer 305. For instance, it is advantageous for the barrier layer 1110 to have a thickness of between about 2 and about 20 nm and more preferably between about 5 and about 10 nm. It is also preferable for the metal layer 305 to be substantially free of the same elements that comprise the barrier layer 1110. For the purposes of the present invention, the term substantially free is defined as less than about 1 atomic percent of the aforementioned elements.

For instance, it is advantageous for the metal element of the barrier layer 1110 to be different from that used in the metal layer 305. This facilitates the removal of unwanted portions of the barrier layer 1110 in the nMOS device by etching procedures without removing the metal layer 305. For instance, when the metal layer 305 is made of tungsten, it is preferable but not required that tungsten is not the metal element of the barrier layer 1110. In such instances, therefore, a conductive barrier of tantalum nitride or titanium nitride is preferred over tungsten nitride.

In addition, it is preferable for the metal layer 305 to be substantially free of the anionic elements of the barrier layer 1110. This advantageously ensures that the work function of the metal layer 305 remains matched to the valence or conduction band of the substrate.

Figure 11B:
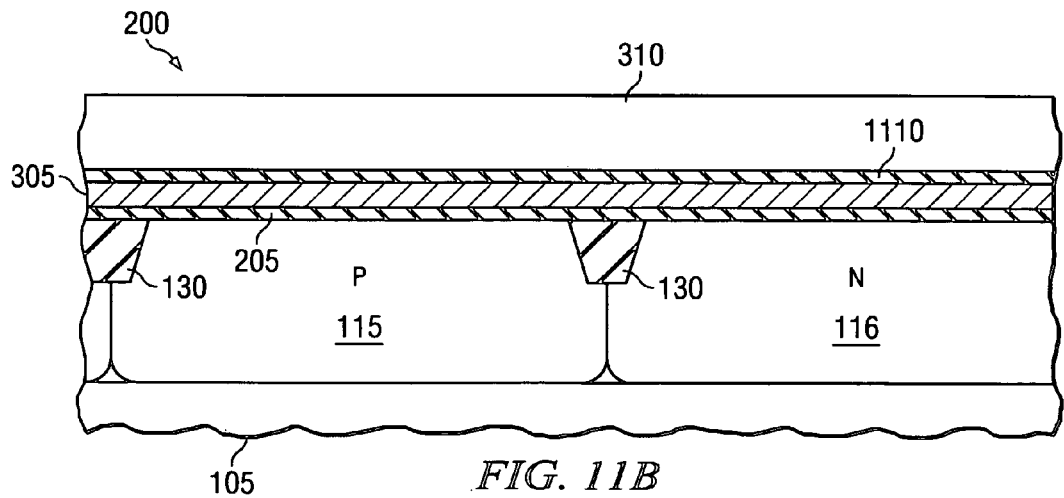
Figure 11C:
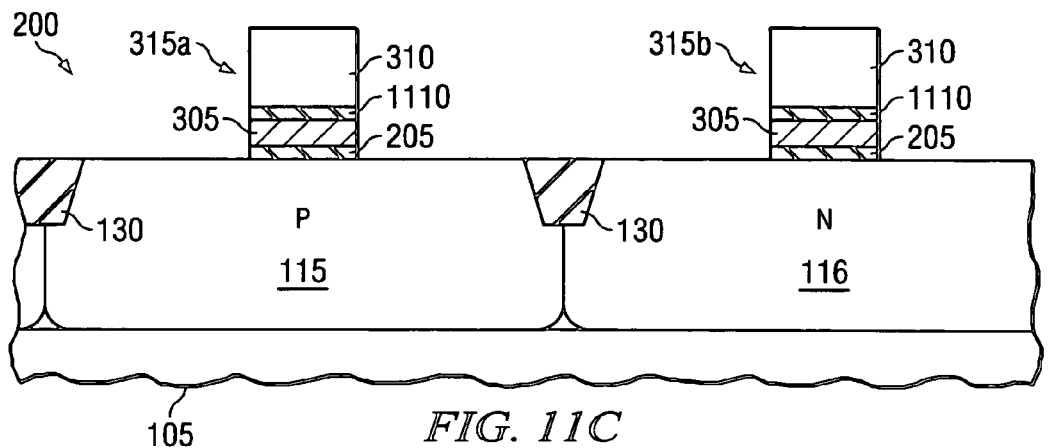

FIG. 11B simply shows the deposition of the sacrificial layer 310 over the barrier layer 1110. The sacrificial layer 310 is the same as that discussed above, including the alternative materials and manner of deposition. FIG. 11C shows the patterning of the sacrificial layer 310 to form the nMOS stacked gate structure 315a and the pMOS stacked gate structure 315b, which each now includes the barrier layer 1110 located over the metal layer 305. It should be noted that the barrier layer 1110 is also useful for when the metal layer 305 might react with the sacrificial layer 310. In such embodiments, the same process flows as set forth FIGS. 8A-8F, 9A-E, and 10A-B could be followed with the exception that the barrier layer 1110 would be removed from both the nMOS stacked gate structure 315a and pMOS stacked gate structure 315b when the sacrificial layer 310 is removed.

Figure 11D:
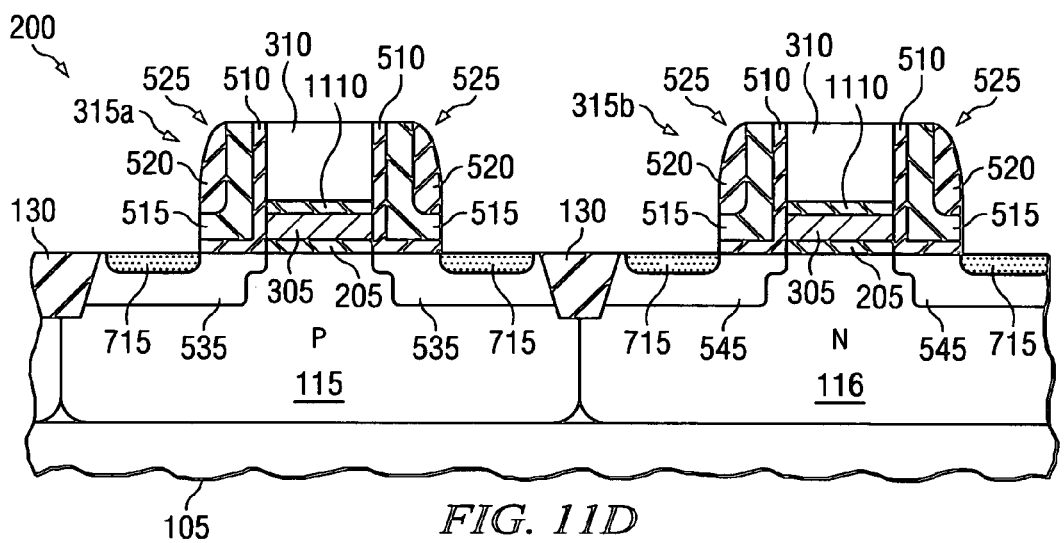
Figure 11E:
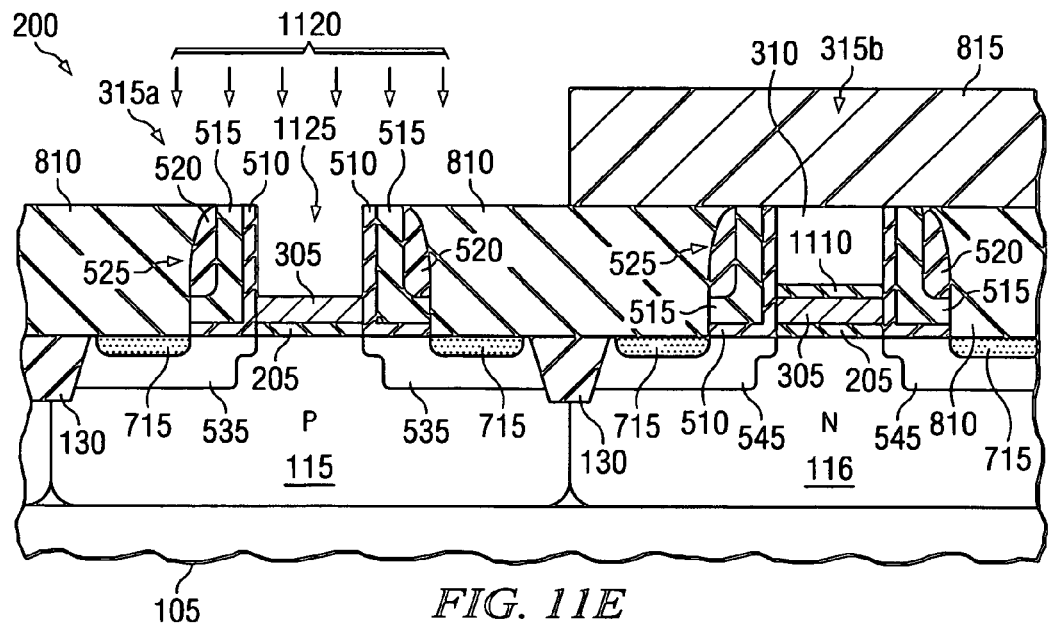

At this point, the same processes discussed above regarding FIGS. 4A through 7B can be used to arrive at the microelectronics device 200 illustrated in FIG. 11D. Also at this point, this embodiment departs somewhat from those discussed above. In FIG. 11E, the etch mask 815 is conventionally deposited and patterned to cover the pMOS stacked gate structure 315b as with previously discussed embodiments. A conventional etch 1120 is then conducted to remove the sacrificial gate layer 310 and the barrier layer 1110 and form an nMOS gate opening 1125. It should be understood that the etching chemistry will need to be changed, depending on the material that is being removed from the nMOS stacked gate structure 315a. For example, the tri-methyl ammonium hydroxide or ammonium hydroxide etches discussed above may be first used to remove the sacrificial layer 310. This would then be followed by an etch chemistry that would etch the barrier layer 1110 but that would not remove the metal layer 305. In an advantageous embodiment, the etch chemistry may comprise a fluorine based plasma chemistry, such as chlorine tetra fluoride flowed with oxygen and an inert carrier gas.

Figure 11F:
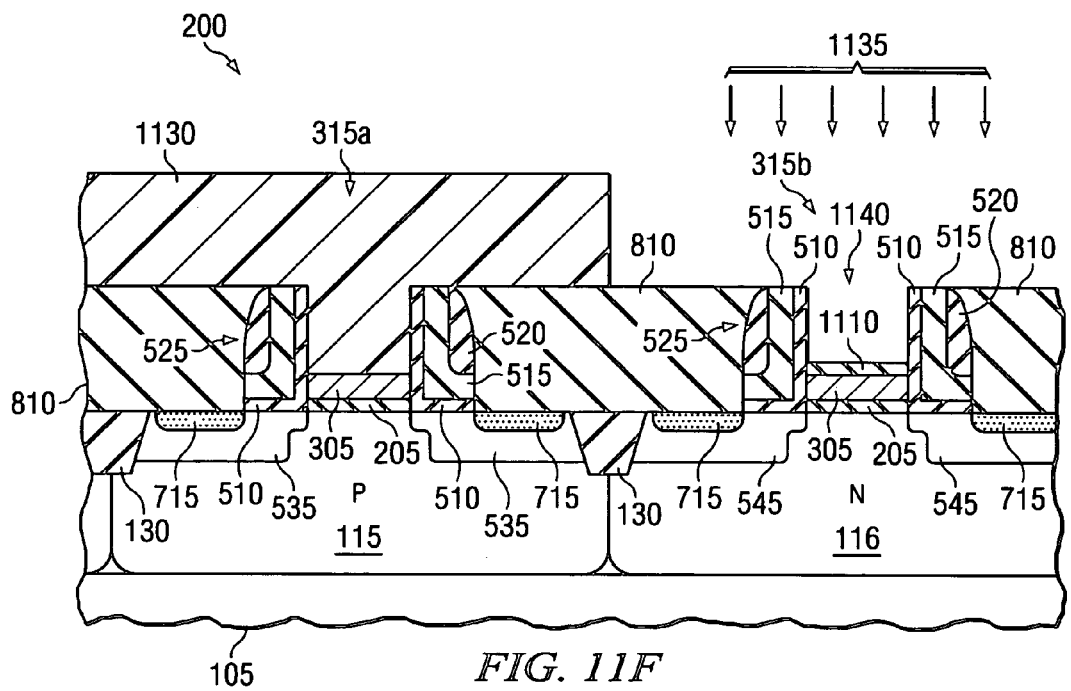

Referring now to FIG. 11F, after the removal of the sacrificial layer 310 and the barrier layer 1110, a conventional etch mask 1130 is deposited and patterned to protect the nMOS stacked gate structure 315a from a subsequent etch process 1135, though if etch process 1135 does not substantially etch metal layer 305 the mask 1130 can be eliminated. Etch 1135, which is preferably the same as the previous etch 1120, is conducted to remove the sacrificial layer 310 from the pMOS stacked gate structure 315b and form pMOS gate opening 1140. However, unlike the process just described with respect to the nMOS stacked gate structure 135a, the barrier layer 1110 in this step is left in tact to protect the metal layer 305 and prevent diffusion of an over lying metal layer into the metal layer 305. Since the metal layer 305 that is selected in this embodiment already has a work function suitable for a pMOS device, it is not necessary to modify the work function of the metal layer 305 as far as the pMOS device is concerned. Thus, the barrier layer 1110 prevents any undesired modification of the work function of the pMOS device. In an exemplary embodiment, the metal layer 305 is tungsten and the barrier layer 1110 is tantalum nitride.

Figure 11G:
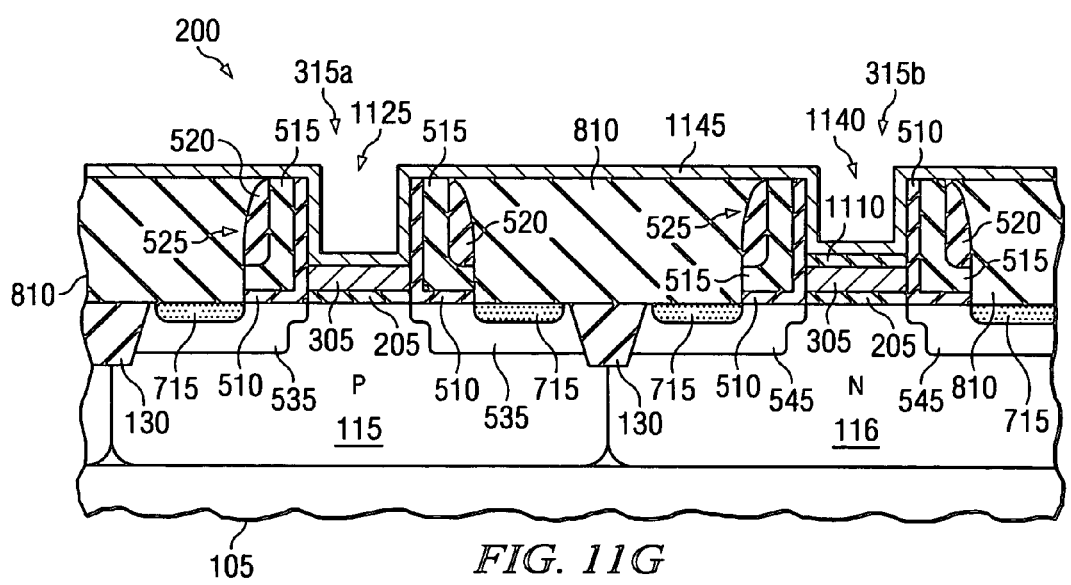

Turning now to FIG. 11G, following the removal of the sacrificial layer 310 from the pMOS stacked gate structure 315b, a metal layer 1145 is conventionally deposited over the microelectronics device 200 and within both the nMOS gate opening 1125 and pMOS gate opening 1140. The metal layer 1145 is selected to appropriately modify the work function of the metal layer 305 within the nMOS gate opening 1125. The metals that can be used are the same ones discussed above with respect to forming the nMOS device, which include vanadium, tantalum, niobium, titanium, zirconium, hafnium, scandium, yttrium, lanthanum, or ytterbium. In an advantageous embodiment, the metal layer 305 is tungsten, the barrier layer 1110 is tantalum nitride, and the metal layer 1145 is tantalum. Further, the thickness must be selected to adequately adjust the work function of the metal layer 305 in the nMOS stacked gate structure 315a. An exemplary thickness is about 1 nm or greater.

Figure 11H:
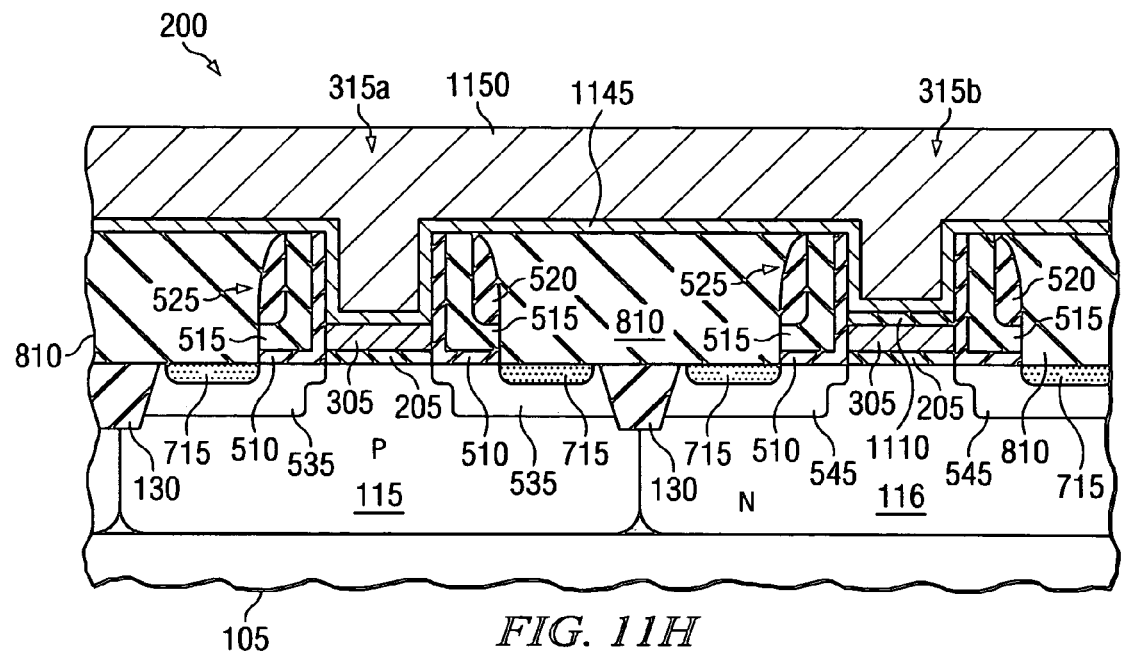
Figure 11I:
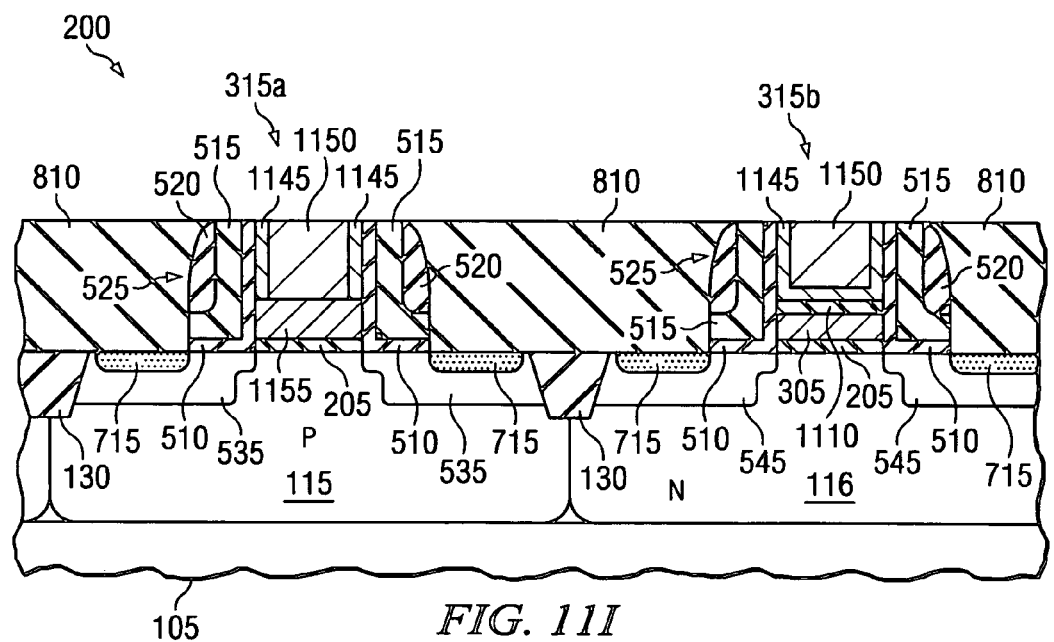

As with previous embodiments, a contact metal layer 1150 is deposited over the metal layer 1145, as illustrated in FIG. 11H. In the illustrated embodiment, the previously-discussed anneal is not conducted, however, in alternative embodiments, the anneal may be conducted at this point of manufacture. The excess metal layer 1150 and the metal layer 1145 in the field of the microelectronics device are conventionally removed, as with previous embodiments. Following this step, the anneal may be conducted to modify the metal layer 305 in the nMOS 315a stacked gate structure and form the nMOS metal gate electrode 1155 to arrive at the structure shown in FIG. 11I. As noted above, the barrier layer 1110 prevents any modification of the work function of the metal layer 305 in the pMOS stacked gate structure 315b.

Figure 12:
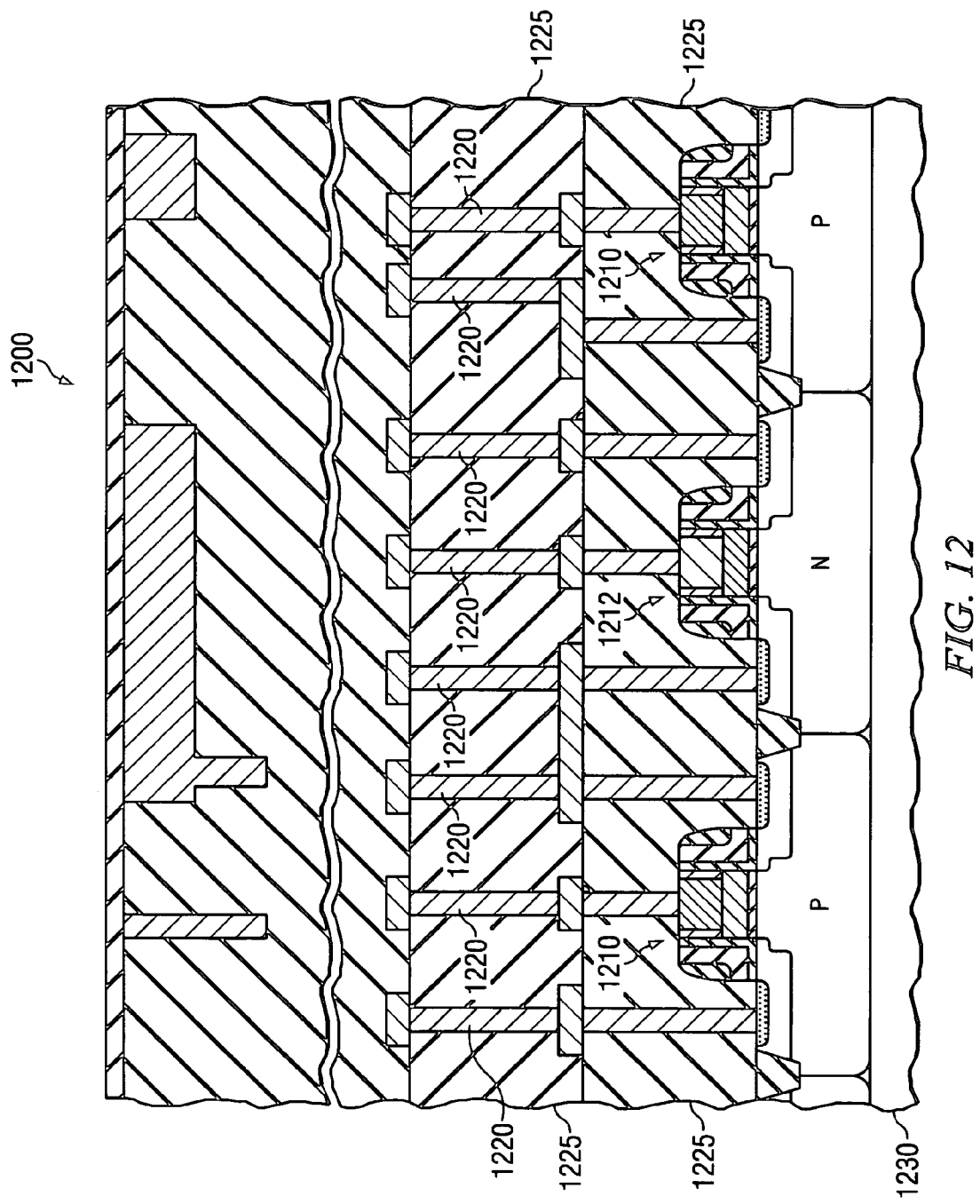
FIG. 12 illustrates an exemplary cross-sectional view of an integrated circuit (IC) incorporating devices constructed according to the principles of the present invention.

FIG. 12 presents a cross-sectional view of yet another embodiment of the present invention, an integrated circuit 1200. The integrated circuit 1200 depicted in FIG. 12, includes a dual work function metal gate microelectronic transistors 1210, 1212. Each of the transistors 1210, 1212 may comprise the components illustrated in either FIG. 9E. 10B or FIG. 11I. The integrated circuit 1200 also includes interconnects 1220 located on or within one or more insulating layers 1225 that interconnect the transistors 1210, 1212 to form an operative integrated circuit 1200.

The transistors 1210, 1212 and other device components can be formed according to any of the embodiments described herein. The work function of the transistor 1210 is matched to the conduction band of the substrate 1230, while the work function of the transistor 1212 is matched to valence band of the substrate 1230.

Although the present invention has been described in detail, one of ordinary skill in the art should understand that they can make various changes, substitutions and alterations herein without departing from the scope of the invention.

What is claimed is:

1. A process for forming a dual work function metal gate microelectronics device, comprising:
    forming a stacked gate structure in each of a pMOS region and an nMOS region of a microelectronics substrate, the gate structure comprising a gate dielectric, a first metal layer located over the gate dielectric and a sacrificial gate layer located over the first metal layer;
    removing the sacrificial gate layer in at least one of the nMOS or pMOS regions, thereby forming a gate opening;
    forming at least a second metal layer over the first metal layer and within the gate opening in the NMOS region thereby modifying the first metal layer within the gate opening in the NMOS region to form a NMOS gate electrode with a desired work function.

2. The process recited in claim 1, wherein the second metal layer is vanadium, tantalum, niobium, titanium, zirconium, hafnium, scandium, yttrium, lanthanum, or ytterbium.

3. The process recited in claim 2, wherein the sacrificial gate layer is removed from the pMOS region and a third metal layer is deposited in the gate opening in the pMOS region and modifying comprises incorporating a portion of the third metal layer into the first metal layer to form a pMOS gate electrode with a desired pMOS work function.

4. The process recited in claim 3 wherein the third metal layer is platinum, iridium, nickel, cobalt, ruthenium, rhodium, or rhenium.

5. The process recited in claim 3, further comprising forming a metal contact in each of the nMOS and pMOS gate openings and over each of the nMOS and pMOS gate electrodes.

6. The process recited in claim 3, wherein the gate dielectric is silicon oxynitride, hafnium silicon oxynitride, hafnium oxide, hafnium oxynitride, zirconium oxide, zirconium silicon oxynitride, zirconium oxynitride, or tantalum silicon oxynitride, and the first metal layer is tungsten silicide, the second metal layer is tantalum and the third layer is platinum.

7. The process recited in claim 3 wherein incorporating the second metal layer and the third metal layer is conducted simultaneously.

8. The process recited in claim 3 wherein incorporating is conducted at a low temperature.

9. The process recited in claim 8 wherein the low temperature does not exceed about 400 degrees Celsius.

10. The process recited in claim 1 further comprising forming source/drains adjacent the stacked gate structure prior to removing the sacrificial gate layer.

11. The process recited in claim 10 further comprising forming sidewall spacers adjacent the stacked gate structure prior to removing the sacrificial gate layer.

12. The process recited in claim 11, wherein the sidewall spacers comprise silicon dioxide or silicon nitride carbide.

13. The process recited in claim 11 further comprising forming silicided contacts adjacent the stacked gate structure prior to removing the sacrificial gate layer.

14. The process recited in claim 11 wherein a material used to form the sacrificial gate layer is chosen such that the sacrificial gate layer can be selectively removed with respect to the sidewall spacers.

15. The process recited in claim 14, wherein the sacrificial gate layer is silicon nitride and the sidewall spacer comprises silicon nitride and carbon.

16. The process recited in claim 1, wherein the gate structure further comprises a barrier metal layer located between the first metal layer and the sacrificial gate layer.

17. The process recited in claim 16, wherein removing includes removing the sacrificial gate layer in both the nMOS and pMOS regions to form an nMOS gate opening and a pMOS gate opening and the method further comprises forming a second metal layer in the nMOS gate opening and the pMOS gate opening over the barrier metal layer prior to modifying the first metal layer.

18. The process recited in claim 17, wherein the first metal layer is tungsten, the barrier metal layer is tantalum nitride, and the second metal layer is tantalum, and wherein the barrier metal layer is removed from within the gate opening in the nMOS region prior to the second metal layer being deposited.

19. The process recited in claim 1, wherein the sacrificial gate layer is silicon.

20. The process recited in claim 1, wherein the sacrificial gate layer is silicon nitride, silicon carbide, silicon dioxide or silicon germanium.

21. The process recited in claim 1, wherein the first metal layer is tungsten, tungsten nitride, tungsten carbide, tungsten silicide, tantalum silicide, tantalum nitride, tantalum silicon nitride, tantalum carbide, molybdenum, molybdenum silicide, niobium silicide, molybdenum carbide, ruthenium, or ruthenium carbide.

22. The process recited in claim 1, wherein the gate dielectric is silicon oxynitride, hafnium silicon oxynitride hafnium oxide, hafnium oxynitride, zirconium oxide, zirconium silicon oxynitride, zirconium oxynitride, or tantalum silicon oxynitride, and the first metal layer comprises tungsten.

23. A process for forming an integrated circuit having dual work function metal gates, comprising:
    forming transistors over a microelectronics substrate, comprising:
        building a transistor gate, comprising:
            forming a stacked gate structure in each of a pMOS region and an nMOS region of a microelectronics substrate, the gate structure comprising a gate dielectric, a first metal layer located over the gate dielectric and a sacrificial gate layer located over the first metal layer;
            removing the sacrificial gate layer in at least one of the nMOS or pMOS regions, thereby forming a gate opening;
            modifying the first metal layer within the gate opening of the NMOS region to form a NMOS gate electrode with a desired NMOS work function;
        forming source/drains in the microelectronics substrate prior to removing the sacrificial gate layer; and
    forming interconnects in dielectric layers located over the transistors to interconnect the transistors and form an operative integrated circuit.

* * * * *